United States Patent
Takahashi et al.

(10) Patent No.: US 6,995,396 B2
(45) Date of Patent: Feb. 7, 2006

(54) SEMICONDUCTOR SUBSTRATE, SEMICONDUCTOR DEVICE AND METHOD FOR FABRICATING THE SAME

(75) Inventors: Kunimasa Takahashi, Osaka (JP); Masao Uchida, Osaka (JP); Makoto Kitabatake, Nara (JP); Toshiya Yokogawa, Nara (JP); Osamu Kusumoto, Nara (JP); Kenya Yamashita, Osaka (JP); Ryoko Miyanaga, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/279,119

(22) Filed: Oct. 24, 2002

(65) Prior Publication Data

US 2003/0080384 A1    May 1, 2003

(30) Foreign Application Priority Data

Oct. 25, 2001  (JP) ............................. 2001-327710
Dec. 4, 2001   (JP) ............................. 2001-370129

(51) Int. Cl.
*H01L 31/0312*  (2006.01)
*H01L 29/80*    (2006.01)
*H01L 31/112*   (2006.01)
*H01L 29/76*    (2006.01)
*H01L 27/095*   (2006.01)

(52) U.S. Cl. ..................... 257/77; 257/280; 257/289; 257/472

(58) Field of Classification Search ................. 257/77, 257/279, 280, 289, 472
See application file for complete search history.

(56) References Cited

U.S. PATENT DOCUMENTS

| 5,363,800 A | 11/1994 | Larkin et al. |
| 6,270,573 B1 | 8/2001 | Kitabatake et al. |
| 2003/0052321 A1 * | 3/2003 | Sridevan .................. 257/77 |

FOREIGN PATENT DOCUMENTS

| JP | 10-261615 | 9/1998 |
| JP | 11-162850 | 6/1999 |

(Continued)

OTHER PUBLICATIONS

H. Tsuchida et al., "Growth of Thick and Low-Doped 4H-SiC Epitaxial Layers in a Vertical Radiant-Heating VPE Reactor", T. IEE Japan, vol. 121-A, No 2, 2001, pp149-156.

(Continued)

*Primary Examiner*—Ngân V. Ngô
(74) *Attorney, Agent, or Firm*—McDermott Will & Emery LLP

(57) ABSTRACT

A SiC bulk substrate whose top face has been flattened is placed in a vertical thin film growth system to be annealed in an inert gas atmosphere. A material gas of Si is then supplied at a flow rate of 1 mL/min. at a substrate temperature of 1200° C. through 1600° C. Subsequently, the diluent gas is changed to a hydrogen gas at a temperature of 1600° C., and material gases of Si and carbon are supplied with nitrogen intermittently supplied, so as to deposit SiC thin films on the SiC bulk substrate. In a flat δ-doped multilayered structure thus formed, an average height of macro steps formed on the top face and on interfaces therein is 30 nm or less. When the resultant substrate is used, a semiconductor device with a high breakdown voltage and high mobility can be realized.

11 Claims, 21 Drawing Sheets

FOREIGN PATENT DOCUMENTS

| | | | |
|---|---|---|---|
| JP | 2000-294777 A | 10/2000 |
| JP | P2000-319099 A | 11/2000 |
| WO | WO 00/79570 A2 | 12/2000 |
| WO | WO 01/67521 A1 | 9/2001 |

OTHER PUBLICATIONS

V. Papaioannou et al.; "Study of 4H- and 6H-SiC Films Grown on Off-Oriented (0001) SiC Substrates", Journal of Crystal Growth 194 (1998), PP342-352.

* cited by examiner

SEMICONDUCTOR SUBSTRATE, SEMICONDUCTOR DEVICE AND METHOD FOR FABRICATING THE SAME

BACKGROUND OF THE INVENTION

The present invention relates to a semiconductor substrate of SiC or the like, a semiconductor device and a method for fabricating a semiconductor device, and more particularly, it relates to a technique to flatten an interface or a top face of a semiconductor layer.

In order to improve the operation speed and the performance of a semiconductor device, semiconductor materials other than silicon (Si) have been studied and developed all over the world.

One of new semiconductor materials is silicon carbide (SiC). Since SiC has a larger band gap than Si, it is expected to be applied to a power device, a high-frequency device and a high-temperature operating device of the next generation. Also, there are a large number of polytypes of SiC such as 3C—SiC (β-SiC) of the cubic system, 6H—SiC and 4H—SiC of the hexagonal system, and 15R—SiC of the rhombohedral system. Among these polytypes, 6H—SiC and 4H—SiC are generally used for fabricating a practical SiC-based semiconductor device, and a substrate having the (0001) plane vertical to the crystal c-axis of this polytype is widely used.

A SiC thin film is grown on a SiC bulk substrate generally by a step-controlled epitaxial growth technique. In this epitaxial growth technique, the step density on a substrate top face is increased by intentionally inclining the (0001) plane of the SiC bulk substrate at a small angle (of several degrees), so that a SiC thin film can be grown through step flow by the growth in a lateral direction of the step. When this technique is applied to SiC having a large number of polytypes, a thin film of the same polytype as that of a substrate can be advantageously grown because information of the cycle of atomic arrangement can be obtained from the step. Therefore, in the current technique, the (0001) plane serving as a reference plane is generally given an off angle of 8 degrees in 4H—SiC and of 3.5 degrees in 6H—SiC in the [11-20] direction.

Now, a SiC substrate used in a SiC-based semiconductor device and a method for fabricating the SiC substrate will be described.

FIG. 18 is a diagram for schematically showing a general vertical thin film growth system for growing a SiC layer.

As shown in FIG. 18, the vertical thin film growth system for SiC includes a reactor 1120, a susceptor 1122 of carbon, a support axis 1123 for supporting the susceptor, a coil 1124 coiled around the reactor 1120 for heating, a gas supply system 1128 for supplying, to the reactor 1120, a material gas 1125, a carrier gas 1126 and a dopant gas 1127, a gas exhaust system 1129 for evacuating the reactor 1120, an exhaust pipe 1130 for connecting the reactor 1120 and the gas exhaust system 1129, and a valve 1131 provided on the exhaust pipe 1130. The pressure within the reactor 1120 is controlled by using the valve 1131.

In epitaxially growing a SiC thin film, a substrate 1121 is placed on the susceptor 1122, and the material gas 1125, the carrier gas 1126 and the dopant gas 1127 are supplied from the gas supply system 1128 to the reactor 1120. At this point, the susceptor 1122 is heated through high frequency induction heating using the coil 1124, and hence, the substrate temperature is increased to an epitaxial growth temperature. Also, cooling water is circulated in a peripheral portion 1132 of the system.

FIGS. 19A and 19B are cross-sectional views for showing a method for fabricating a conventional SiC substrate having a SiC multilayered structure using the vertical thin film growth system. FIG. 20 is a diagram for showing change with time of various conditions for the growth of a conventional SiC thin film. Now, a method for fabricating a conventional SiC substrate will be described with reference to these drawings.

First, in a procedure shown in FIG. 19A, a SiC bulk substrate 1101 is placed on the susceptor 1122 of the vertical thin film growth system. Then, a hydrogen gas is introduced as the carrier gas 1126 from above the reactor 1120, and the pressure within the reactor 1120 is adjusted to an atmospheric pressure or less by using the valve 1131. Under this condition, the SiC bulk substrate 1101 is annealed, so as to increase the substrate temperature to the epitaxial growth temperature, that is, 1500° C. or more.

Next, as shown in FIG. 20, without changing the flow rate of the hydrogen gas, a gas including carbon (such as a propane gas) and a gas including silicon (such as a silane gas) are introduced as the material gas 1125 at certain flow rates. Thus, SiC crystal is epitaxially grown on the top face of the SiC bulk substrate 1101. At this point, the pressure within the reactor 1120 is set to 90 kPa. In the case where an n-type doped layer is to be grown, for example, nitrogen is introduced as the dopant gas 1127, and in the case where a p-type doped layer is to be grown, for example, trimethyl aluminum is introduced from the gas supply system 1128 to the reactor 1120.

Then, in a procedure shown in FIG. 19B, with the flow rates of the hydrogen gas (i.e., the carrier gas 1126) and the silane gas and the propane gas (i.e., the material gas 1125) fixed as shown in FIG. 20, desired SiC thin films, such as an undoped layer including no dopant, a p-type doped layer and an n-type doped layer, are deposited on the substrate. At this point, the SiC thin films are deposited so that two layers adjacent to each other with an interface sandwiched therebetween can respectively include a dopant in different concentrations or respectively include dopants of different conductivity types. Hereinafter, a portion in which a plurality of SiC thin films are thus deposited is designated as a SiC multilayer part 1103, and a portion of the SiC bulk substrate in contact with the SiC multilayer part 1103 is designated as a SiC bulk substrate top face 1102.

Subsequently, the supply of the propane gas and the silane gas is stopped and the annealing of the substrate is stopped, so as to end the growth of the SiC thin films. Thereafter, the resultant substrate is cooled in a hydrogen gas atmosphere.

The conventional SiC substrate fabricated in the aforementioned manner includes the SiC bulk substrate 1101 and the SiC multilayer part 1103 epitaxially grown on the SiC bulk substrate 1101.

In the conventional SiC substrate, the number and the combination of SiC thin films included in the SiC multilayer part 1103 may be changed depending upon the type of device in which the substrate is to be used. For example, when an undoped layer and an n-type doped layer are successively grown on the SiC bulk substrate 1101 with a gate electrode, a source electrode and a drain electrode provided on the n-type doped layer, a MESFET (Metal Semiconductor Field Effect Transistor) can be fabricated. Alternatively, when an n-type SiC layer, a p-type SiC layer and an n-type SiC layer are deposited in this order in the upward direction in the SiC multilayer part 1103, a pn diode can be fabricated.

Alternatively, a semiconductor device without the SiC multilayer part 1103 can be fabricated by using the same thin film growth system.

In the conventional method for fabricating a SiC substrate, however, since a SiC film is grown on a substrate inclined at an off angle as described above, sawtooth-shaped irregularities, which is designated as macro steps, are disadvantageously formed on the top faces of the SiC bulk substrate and the SiC thin film.

The macro steps 1104 shown in FIGS. 19A and 19B are caused by combining several or several tens steps of atomic layers larger than a monolayer, and in general, a step height (indicated as $\alpha$ in FIG. 19A) is 50 nm or more and a terrace width (indicated as $\beta$ in FIG. 19A) is 500 nm or more.

Therefore, when the conventional SiC substrate having the macro steps 1104 is used for a semiconductor device, good electric characteristics innate in SiC cannot efficiently lead to the performance of the semiconductor device. For example, when it is used for a Schottky diode, an electric field is collected at the tip of the macro step in a Schottky electrode provided on a SiC thin film, so as to disadvantageously lower the breakdown voltage. Alternatively, when it is used for a MESFET in which the surface layer of a SiC thin film is used as a channel, carriers are disturbed by the macro steps, and hence, the carrier mobility is lowered so as to disadvantageously lower the mutual conductance. Further alternatively, when it is used for a MESFET in which a gate insulating film is formed on the top face of a SiC thin film, the oxide film has different thicknesses between a step wall and a terrace of the macro step, and hence, an inverted layer formed under application of a gate voltage has an uneven thickness, so as to disadvantageously lower the channel mobility.

In this manner, even when a conventional SiC substrate is used for fabricating a semiconductor device, electric characteristics that can be expected based on good physical property values innate in SiC cannot be attained by the conventional method.

The aforementioned disadvantages particularly clearly appear when an epitaxially grown SiC thin film has a small thickness. This is because, when the size of the macro step is large as compared with the thickness of the SiC thin film, the macro step relatively largely affects the device characteristic. In addition, when the grown SiC thin film has a multilayered structure as shown in FIG. 19B, the influence on the device using the SiC substrate is further larger.

An example of the multilayered structure of a SiC thin film is a δ-doped multilayered structure. A δ-doped layer is a layer that has a thickness of approximately 10 nm, includes a dopant in a high concentration and has an abrupt concentration profile. In the δ-doped multilayered structure, a combination of a δ-doped layer and an undoped layer including a dopant in a concentration lower by one or more figures than the δ-doped layer is repeatedly formed. When the δ-doped multilayered structure is utilized for a semiconductor device, the fabricated semiconductor device can attain a high breakdown voltage property capable of operating at a high speed. In other words, in employing the δ-doped multilayered structure, when the semiconductor device is in an off state, the entire active region is depleted and hence the breakdown voltage can be increased, and when the semiconductor device is in an on state, carriers leached from the δ-doped layer can move through the undoped layer with a small resistance, and hence, the carrier mobility can be large. In a device using this structure, however, the thickness of a layer serving as a channel region or the like is controlled at the level of 10 nm, and therefore, the irregularities of the macro steps largely harmfully affect the device, and hence, the mobility is unavoidably lowered.

As described so far, in the case where a conventional SiC substrate is used, the macro steps are formed not only on the top face of a SiC bulk substrate but also on an interface between SiC thin films, and the irregularities are caused also in the δ-doped multilayered structure. Therefore, it is difficult to obtain electric characteristics expected based on the good physical property values innate in SiC. Accordingly, there are increasing demands for a SiC substrate and a semiconductor device in which not only the top face but also the interface between SiC thin films is flat.

Although there was a report in consideration of the flatness of the top face alone of a SiC film, as in a method described in the transactions of Japanese Electro-technical Committee, 2001, vol. 121, No. 2, p. 149, there has been no report on a technique in consideration of the flatness on an interface between deposited SiC layers. Also, even when the flatness on the top face is considered, it has been difficult to fabricate a device sufficiently and efficiently utilizing the good characteristics of a material.

Also, the performance lowering of a device derived from the macro steps occurs not only in a SiC substrate but also in a SiGe substrate, a GaN (gallium nitride) substrate and a GaAs substrate inclined by an off angle. Therefore, a method for suppressing macro steps applicable to growth of a material other than SiC is desired.

SUMMARY OF THE INVENTION

An object of the invention is providing a method for growing a semiconductor thin film having flat interface and top face, so as to provide a semiconductor substrate, a semiconductor device and a method for fabricating a semiconductor device that can exhibit good characteristics.

The first semiconductor substrate of this invention includes a SiC bulk substrate; and a SiC deposited layer including a dopant and provided over the SiC bulk substrate, and assuming that the SiC deposited layer has a thickness t and that irregularities formed on a top face of the SiC deposited layer have a step height h, a ratio h/t between the step height and the thickness of the SiC deposited layer is in a range from $10^{-6}$ to $10^{-1}$, and the step height is 10 nm or less.

Therefore, when the first semiconductor substrate of this invention is used for fabricating a semiconductor device in which the SiC deposited layer works as a channel layer, the carrier mobility can be improved because the top face of the SiC deposited layer is substantially flat. Also, since the ratio h/t between the step height and the thickness of the SiC deposited layer is in the range from $10^{-6}$ to $10^{-1}$ and the step height is 10 nm or less, a semiconductor device such as a MISFET, a MESFET or a diode exhibiting performance at a practically usable level can be provided by using the semiconductor device.

In an aspect where an average step height of the irregularities formed on the top face of the SiC deposited layer is 5 nm or less, a semiconductor device having a higher breakdown voltage and a higher operation speed can be realized by using this semiconductor substrate.

In an aspect where the SiC deposited layer is formed by epitaxial growth, a semiconductor device having better electric characteristics can be realized.

In one aspect, a top face of the SiC bulk substrate is selected from the group consisting of an offcut plane with an off angle of 0 through 10 degrees of the β-SiC (111) plane, the α-SiC (0001) plane of 6H—SiC or 4H—SiC, or the Si plane of 15R—SiC, and an offcut plane with an off angle of 0 through 15 degrees of the β-SiC (100) plane, the β-SiC (110) plane, the α-SiC (1-100) plane of 6H—SiC or 4H—SiC, or the α-SiC (11-20) plane. Thus, the SiC deposited layer can be more easily formed than when a substrate having, as a principal plane, the carbon plane of SiC is used, and hence, the fabrication efficiency can be improved. Also, since the substrate is given an off angle, the SiC deposited layer having a crystal structure of the same polytype as that of the SiC bulk substrate can be formed.

The second semiconductor substrate of this invention includes a SiC bulk substrate; and an epitaxially grown layer of SiC provided over the SiC bulk substrate, and the epitaxially grown layer has a structure in which a first SiC layer and a second SiC layer including a carrier dopant in a concentration higher than in the first SiC layer and having a thickness smaller than the first SiC layer are alternately deposited, and assuming that the first SiC layer has a thickness t and that irregularities formed on a top face of the first SiC layer have a step height h, a ratio h/t between the step height and the thickness of the first SiC layer is in a range from $10^{-6}$ to $10^{-1}$, and an average step height is 5 nm or less.

Therefore, when the second semiconductor substrate of this invention is used for fabricating a semiconductor device using the first SiC layer as a channel layer, the carrier mobility can be improved because the top face of the first SiC layer is substantially flat. Also, since the ratio h/t between the step height and the thickness of the first SiC layer is in the range from $10^{-6}$ to $10^{-1}$ and the average step height is 5 nm or less, a semiconductor device such as a MISFET, a MESFET or a diode exhibiting performance at a practically usable level can be provided by using this semiconductor substrate.

In one aspect, a top face of the bulk substrate is selected from the group consisting of an offcut plane with an off angle of 0 through 10 degrees of the β-SiC (111) plane, the α-SiC (0001) plane of 6H—SiC or 4H—SiC, or the Si plane of 15R—SiC, and an offcut plane with an off angle of 0 through 15 degrees of the β-SiC (100) plane, the β-SiC (110) plane, the α-SiC (1-100) plane of 6H—SiC or 4H—SiC, or the α-SiC (11-20) plane. Thus, the epitaxially grown layer can be formed more easily than when a substrate having, as a principal plane, the carbon plane of SiC is used, and hence, the fabrication efficiency can be improved. Also, since the substrate is given an off angle, the epitaxially grown layer having a crystal structure of the same polytype as that of the SiC bulk substrate can be formed.

The semiconductor device of this invention includes a bulk substrate of a compound semiconductor; and a first compound semiconductor layer epitaxially grown on a top face of the bulk substrate, and the first compound semiconductor layer includes a second compound semiconductor layer in which carriers move or pass during operation, and assuming that the second compound semiconductor layer has a thickness t and that irregularities formed on a top face of the second compound semiconductor layer have a step height h, a ratio h/t between the step height and the thickness of the second semiconductor layer is in a range from $10^{-6}$ to $10^{-1}$, and the step height is 10 nm or less.

Accordingly, in the case where the semiconductor device is a MISFET or a MESFET, the second compound semiconductor layer having a flat top face can be allowed to function as a channel. Therefore, scattering of carriers by the irregularities can be suppressed, so as to improve the operation speed of the semiconductor device to a practically usable level. Alternatively, in the case where the semiconductor device is a diode or the like, the second compound semiconductor layer having the flat top face works as a passage of the carriers, the operation speed and the breakdown voltage property can be improved. The material for the first compound semiconductor layer may be any of SiC, SiGe, SiGeC or a group III-V semiconductor for attaining this effect.

In an aspect where an average step height of the irregularities formed on a top face of the first compound semiconductor layer is 5 nm or less, the breakdown voltage property and the operation speed of the semiconductor device can be further improved.

In an aspect where both the bulk substrate and the first compound semiconductor layer are made from SiC, a semiconductor device that has a higher breakdown voltage and is driven by a larger current can be realized as compared with the case where, for example, Si is used.

In one aspect, a top face of the SiC bulk substrate is selected from the group consisting of an offcut plane with an off angle of 0 through 10 degrees of the β-SiC (111) plane, the α-SiC (0001) plane of 6H—SiC or 4H—SiC, or the Si plane of 15R—SiC, and an offcut plane with an off angle of 0 through 15 degrees of the β-SiC (100) plane, the β-SiC (110) plane, the α-SiC (1-100) plane of 6H—SiC or 4H—SiC, or the α-SiC (11-20) plane. Thus, the fabrication efficiency can be improved as compared with the case where a substrate having, as a principal plane, the carbon plane of SiC is used. Also, since the substrate is given an off angle, the SiC layer of the same polytype as that of the bulk substrate can be formed, so that a semiconductor device having good electric characteristics can be realized.

In one aspect, the second compound semiconductor layer functions as a carrier movement region and the first compound semiconductor layer further includes at least one SiC layer that includes a carrier dopant in a concentration higher than in the second compound semiconductor layer, has a thickness smaller than the second compound semiconductor layer, and from which carriers are able to leach into the second compound semiconductor layer by a quantum effect. Thus, the carriers move through the second compound semiconductor layer having a lower dopant concentration, and hence, the carrier mobility is further improved. In particular, since the top face of the second compound semiconductor layer is flattened, the number of carriers scattered by irregularities formed in the second compound semiconductor layer can be reduced, so as to further improve the carrier mobility.

In one aspect, the semiconductor device further includes a first electrode provided on the first compound semiconductor layer to be in Schottky contact with the first compound semiconductor layer; and a second electrode provided on a reverse face of the bulk substrate to function as an ohmic electrode, and the bulk substrate and the first compound semiconductor layer include dopants of an identical conductivity type. Thus, electric field collection caused during the operation on the interface between the first compound semiconductor layer and the first electrode can be reduced, resulting in realizing a Schottky diode with a higher breakdown voltage.

In one aspect, a gate electrode, and a source electrode and a drain electrode respectively spaced from the gate electrode are provided on the first compound semiconductor layer, and the second compound semiconductor layer includes the dopant in a concentration higher than in a portion of the first compound semiconductor layer excluding the second compound semiconductor layer. Thus, the scattering of the carriers in the second compound semiconductor layer working as the channel layer can be suppressed, so as to realize a MESFET capable of high-speed and high-frequency operation, which is conventionally difficult to put to practical use.

In one aspect, the first compound semiconductor layer includes a first epitaxially grown layer of SiC including a dopant of a first conductivity type and epitaxially grown on a principal plane of the bulk substrate; the second compound semiconductor layer provided on the first epitaxially grown layer and including the dopant of a second conductivity type; and a second epitaxially grown layer of SiC including a dopant of the first conductivity type and provided on the second compound semiconductor layer, and the semiconductor device further includes a gate insulating film provided on the first epitaxially grown layer and the second compound semiconductor layer; a gate electrode provided on the gate insulating film; a first ohmic electrode provided on the second epitaxially grown layer; and a second ohmic electrode provided on a face of the bulk substrate opposing a principal plane thereof, and the semiconductor device functions as a vertical MISFET. Since the interface between the second compound semiconductor layer working as the channel and the gate insulating film is thus substantially flattened, the carrier mobility in this region is improved. Accordingly, a MISFET capable of a high-speed operation can be realized.

In one aspect, the semiconductor device further includes a gate insulating film provided on the second compound semiconductor layer; a gate electrode provided on the gate insulating film; and dopant diffusion layers including a dopant and provided in portions of the second compound semiconductor layer on both sides of the gate electrode. Since the second compound semiconductor layer whose top face is flatter than in a conventional device is thus used as the channel, the scattering of the carriers can be suppressed, so as to improve the carrier mobility. Also, since the thickness of the gate insulating film is even as compared with that in the conventional device, the thickness of an inverted layer can be made even. Accordingly, a field effect transistor capable of a high-speed operation can be realized.

The first method of this invention for fabricating a semiconductor device including a substrate and a compound semiconductor layer epitaxially grown, includes the steps of (a) preparing the substrate; and (b), performed after the step (a) and during increase of a substrate temperature for epitaxially growing the compound semiconductor layer, supplying a material including an element, which is a solid in the atmosphere as a simple body and is one element having the lowest melting point among constituent elements of the compound semiconductor layer, at a temperature in a range from a temperature lower than the lowest melting point by a given temperature to an epitaxial growth temperature.

In this method, the material including the element having the lowest melting point is supplied at the temperature in the range from the temperature lower than the melting point by the given temperature to the epitaxial growth temperature in the step (b). Therefore, deposition on the substrate top face of the element can be suppressed. Also, since the material including the element is thus supplied, the substrate can be prevented from being etched, and hence, the formation of macro steps on the top faces of the substrate and the compound semiconductor layer can be suppressed. Therefore, while the carriers are moving in the compound semiconductor layer, the scattering of the carriers by irregularities can be reduced, so that a semiconductor device having a higher operation speed than a conventional device can be fabricated. Also, in the case where a Schottky electrode is provided on the compound semiconductor layer, a Schottky diode in which electric field collection on the interface between the compound semiconductor layer and the Schottky diode is reduced can be fabricated.

In an aspect where the compound semiconductor is SiC and the temperature lower than the lowest melting point by the given temperature is 1200° C., Si is in a state close to a liquid, and hence, the deposition of Si on the substrate top face can be suppressed. Accordingly, the top faces of the bulk substrate and the compound semiconductor layer can be flattened.

Preferably, the material is diluted with an inert gas at a flow rate of 5 L/min. or less and a pressure is set to be not less than $6.7 \times 10^2$ Pa and not more than $1.0 \times 10^5$ Pa in the step (b).

Preferably, the material is a silane gas, and the silane gas is supplied at a flow rate not less than 0.1 mL/min. and not more than 50 mL/min. in the step (b).

In one aspect, the substrate is made from SiC and the substrate having macro steps on a top face thereof is annealed in an atmosphere including hydrogen or hydrogen chloride at a pressure of 10 kPa or less for flattening the macro steps in the step (a). Thus, the flatness of the compound semiconductor layer formed on the substrate can be improved. Therefore, a semiconductor device having a further higher operation speed or a further higher breakdown voltage can be fabricated.

The second method of this invention for fabricating a semiconductor device includes a step of flattening macro steps formed on a top face of a SiC substrate by annealing the SiC substrate in an atmosphere including hydrogen or hydrogen chloride at a pressure of 10 kPa or less.

In this method, the macro steps are etched with hydrogen or hydrogen chloride, and therefore, a semiconductor device with a flat substrate top face can be provided. In particular, when hydrogen is used, the substrate top face can be effectively flattened.

A substrate temperature is preferably in a range from 700° C. to 1700° C. in the step of flattening macro steps.

In one aspect, the method for fabricating a semiconductor device further includes, before the step of flattening macro steps, a step of epitaxially growing a SiC layer on the SiC substrate. Thus, the top face of the SiC layer can be also flattened, and therefore, a semiconductor device that uses SiC as a region where carriers move or pass and exhibits improved operation speed and breakdown voltage property can be fabricated.

In one aspect, the method for fabricating a semiconductor device further includes, before the step of flattening macro steps, a step of implanting dopant ions into the SiC substrate and annealing the SiC substrate for activating the dopant ions. Thus, even in a semiconductor device necessary to be subjected to dopant activation, the electric characteristics such as the operation speed and the breakdown voltage property can be improved.

DETAILED DESCRIPTION OF THE INVENTION

Priorly to description of preferred embodiments of the invention, a thin film growth system used for epitaxial growth of a thin film in the present invention and results of examination made by the present inventors before devising a method for fabricating a semiconductor device of the invention will be described.

-Thin Film Growth System-

Figure 17:
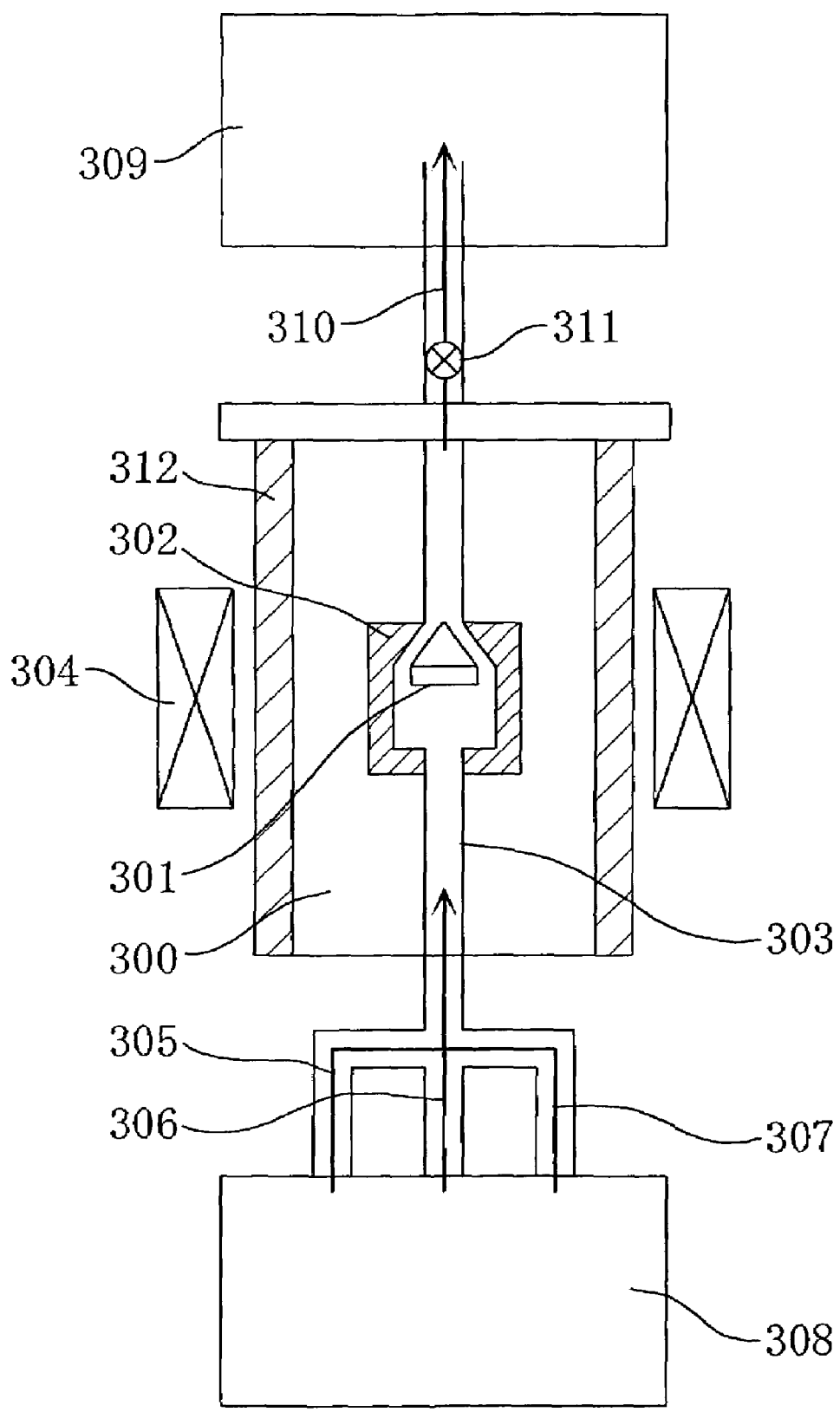
FIG. 17 is a schematic diagram of a general vertical thin film growth system used in the invention.

FIG. 17 schematically shows a vertical thin film growth system used in each embodiment of the invention. As shown in FIG. 17, the vertical thin film growth system includes a reactor 300, a susceptor 302 of carbon in which a substrate 301 is fixed, a support axis 303, a coil 304, a gas supply system 308 for supplying a material gas 305, a diluent gas 306 and a dopant gas 307 to the susceptor 302, a gas exhaust system 309 for exhausting the gas from the susceptor 302, and a pressure adjust valve 311.

In this system, the material gas 305, the diluent gas 306 and the dopant gas 307 are supplied from the gas supply system 308 to the reactor 300 as shown with an arrow in the drawing. The material gas 305, the diluent gas 306 and the dopant gas 307 enter the susceptor 302, and thereafter, are exhausted by the gas exhaust system 309 as shown with an arrow 310. The pressure within the susceptor 302 is controlled by using the pressure adjust valve 311. Also, the susceptor 302 supported by the support axis 303 is heated through high frequency induction heating using the coil 304 coiled around the reactor 300. A cooling water is circulated around the reactor 300.

As a characteristic of this system, the susceptor 302 is hollow, so that thin film growth can be performed inside the susceptor 302. Since the wall of the susceptor 302 is kept at a high temperature during the thin film growth, a reaction by-product is less produced than in a general vertical thin film growth system, so that a thin film with high purity can be grown. Since the material gas is supplied from below in this vertical thin film growth system, the gas flow can be easily controlled.

A SiC film is formed on a substrate by using this vertical thin film growth system generally through the following procedures:

First, a diluent gas (such as a hydrogen gas) is introduced into the susceptor 302, and the pressure within the reactor is adjusted to atmospheric pressure or less. Under this condition, high frequency power is applied to the coil 304 so as to anneal the substrate 301 until the substrate temperature reaches 1500° C. or more.

Next, a gas including carbon (such as a propane gas) and a gas including silicon (such as a silane gas) are introduced into the susceptor 302, so as to grow a film of SiC crystal on the top face of the substrate 301. At this point, a doped layer can be formed by supplying the dopant gas 307 from the gas supply system 308. When an n-type doped layer is to be formed, nitrogen or the like is used as the dopant gas 307, and when a p-type doped layer is to be formed, aluminum or the like is used.

Then, the supply of the material gas 305 is stopped so as to end the growth of the SiC film, the application of high frequency power to the coil 304 is stopped so as to end the annealing, and the substrate 301 is cooled.

-Examination of Conditions for Growing SiC Film-

In order to find a method for growing a SiC film without forming macro steps, attempt was made to find the cause of the formation of the macro steps.

Since the present inventors aimed to flatten not only the top face of a grown SiC film but also the interface between SiC films, both a method for growing a flat SiC film and a method for flattening the top face of a substrate after the growth of the SiC film were searched for.

First, the conventional method for fabricating a SiC substrate was performed with conditions such as the flow rates of the silane gas, the propane gas and the hydrogen gas varied, and the resultant top faces of the SiC substrates obtained under the respective conditions were observed.

As a result, it was found that the macro steps are formed on the substrate top face during annealing of the SiC substrate in the presence of hydrogen, that is, the carrier gas. Specifically, it was found that when the SiC substrate is annealed in a hydrogen gas atmosphere, the substrate top face is etched. Also, the present inventors found that the etching with hydrogen is conspicuous when the substrate temperature is in a range from 1200° C. to the epitaxial growth temperature. In the case of SiC, the upper limit of the epitaxial growth temperature is approximately 1800° C.

On the basis of these finding, conditions for suppressing the formation of the macro steps during the growth of a SiC film by using the vertical thin film growth system of FIG. 17 were examined.

As a result of examining the various conditions such as the gas flow rates, the temperature and the pressure, the following two methods for suppressing the formation of the macro steps were found:

In one method, the material gas of Si is supplied when the substrate temperature reaches 1200° C. while annealing the substrate, and in another method, an inert gas, such as argon (Ar), neon (Ne) or helium (He), is supplied instead of hydrogen from time before annealing the substrate until start of the growth of a SiC layer. It was experimentally confirmed that when these methods are combined, the formation of the macro steps on the top face of a SiC substrate can be effectively suppressed.

The temperature condition suitable to supply the material gas of Si should be in a range from 1200° C. to the epitaxial growth temperature for the following reason:

It seems that the material gas of Si, such as a silane gas, decomposes (cracks) on the SiC substrate top face so as to form a Si-rich top face. In the temperature region from 1200° C. to the epitaxial growth temperature, Si is in a state of a liquid layer or a solid layer close to a liquid layer, and hence, deposition of Si particles on the substrate top face can be suppressed even when the top face is rich with Si. In contrast, in a temperature region lower than 1200° C., Si deposits on the substrate top face. When the Si particles deposit on the substrate top face, the flatness of the substrate top face is largely spoiled. Accordingly, the temperature at which the supply of the silane gas is started should be within the aforementioned range.

However, even when the temperature at which the supply of the silane gas is started is 1200° C. or more, Si unavoidably deposits on the substrate top face if the Si concentration is very high. It was experimentally confirmed that the flow rate of the silane gas supplied before the epitaxial growth for preventing the deposition of Si is not less than 0.1 mL/min. and not more than 50 mL/min.

On the other hand, the flow rate of the inert gas supplied before the substrate temperature reaches the epitaxial growth temperature is preferably 5 L/min. or less. When the flow rate exceeds this, the flatness of the SiC substrate top face may be spoiled.

Furthermore, the pressure within the reactor in supplying the silane gas in addition to the inert gas at the above-described flow rate is preferably not less than approximately $6.7 \times 10^2$ Pa (5.0 Torr) and not more than the atmospheric pressure ($1.0 \times 10^5$ Pa). This is because it was experimentally found that the etching with hydrogen is conspicuous when the pressure is lower than $6.7 \times 10^2$ Pa and because it is technically difficult to anneal under pressure exceeding the atmospheric pressure and hence the cost of a system applicable to such a high pressure is too high for practical use.

Next, the reason why the formation of the macro steps is suppressed by supplying the material gas of Si during the increase of the substrate temperature seems to be as follows:

When hydrogen is present during the increase of the SiC substrate temperature, hydrogen molecules collide with the substrate top face, and hence, the substrate top face is scraped. At this point, Si included in the SiC substrate is first evaporated, and it seems that the evaporated Si reacts with hydrogen so as to proceed a reaction between the SiC and the hydrogen. Therefore, when the material gas of Si is supplied for increasing the concentration of gaseous Si, the equilibrium state shifts to stabilize the SiC, which seems to suppress the decomposition of the SiC.

-Conditions for Forming SiC Film-

Now, conditions for forming a SiC film introduced from the aforementioned examination results will be described.

Figure 2:
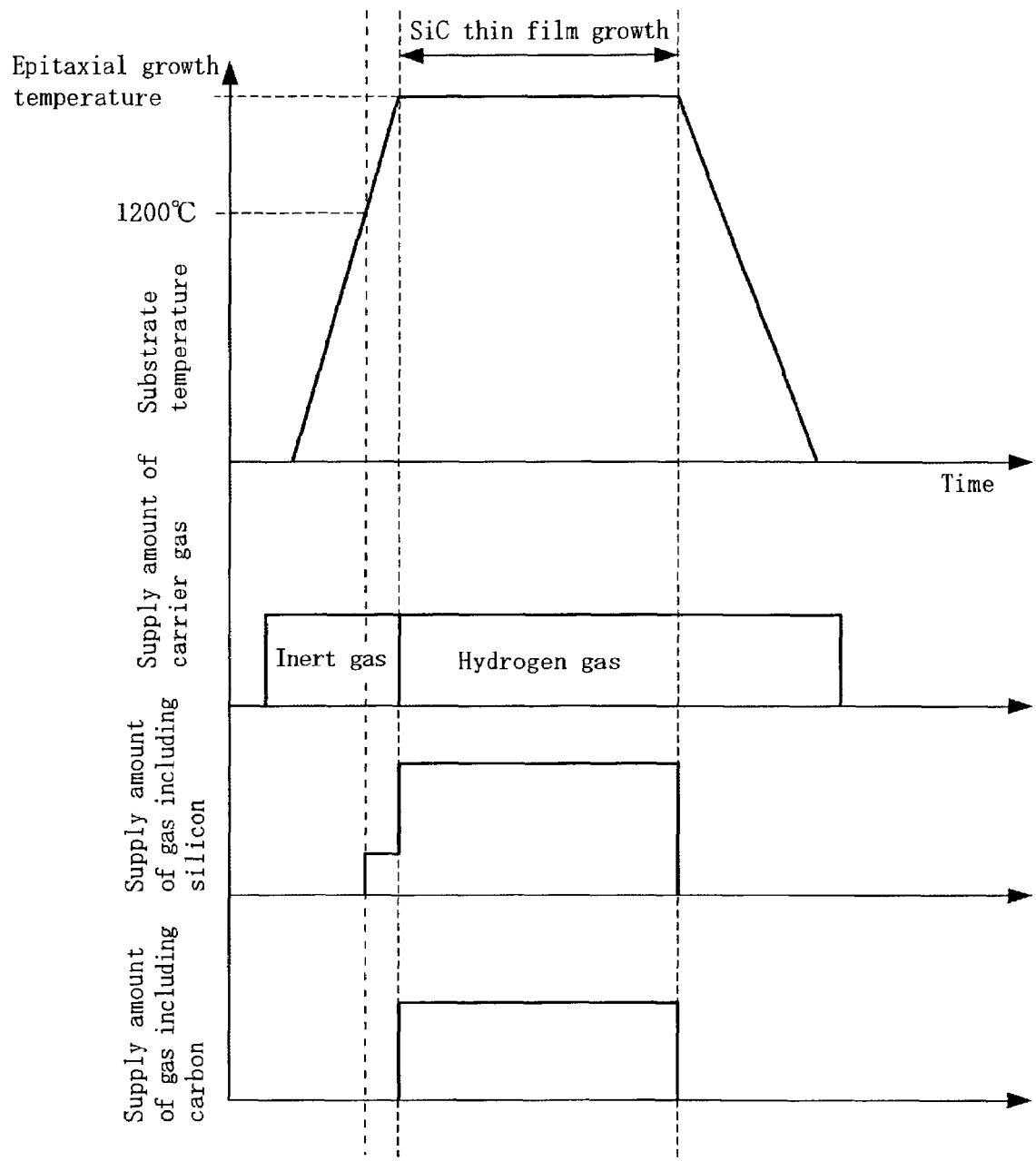
FIG. 2 is a diagram for showing change with time of a substrate temperature, a supply amount of carrier gas and a supply amount of material gas during epitaxial growth of a SiC film in Embodiments 1 through 4.

FIG. 2 is a diagram for showing change with time of a substrate temperature and supply amounts of gases in a method for growing a SiC film employed in each embodiment of the invention.

As shown in FIG. 2, for the epitaxial growth of a SiC film, the substrate 301 of SiC is first placed in the susceptor 302 of the vertical thin film growth system of FIG. 17, and a carrier gas of, for example, argon (Ar) is then introduced into the susceptor 302. Thereafter, with the pressure within the susceptor 302 set to be constant in a range from $6.7 \times 10^2$ Pa to $1.0 \times 10^5$ Pa, the substrate 301 is annealed. In this case, the flow rate of the argon is in a range from 0.1 mL/min. to 50 mL/min.

Next, when the substrate temperature reaches 1200° C., for example, a silane gas is supplied to the susceptor 302 and the substrate is further annealed. When the substrate temperature reaches the epitaxial growth temperature (in a range from 1200° C. to 1800° C.), the carrier gas is switched to a hydrogen gas, and the flow rate of the silane gas is changed to a flow rate (of, for example, 3 mL/min.) for the epitaxial growth. At the same time, a propane gas is supplied as the material gas including carbon at a flow rate of, for example, 2 mL/min. At this point, the pressure within the susceptor 302 is set to $1 \times 10^5$ Pa (1 atm), and the substrate temperature is kept constant. In this manner, a SiC layer is grown on the SiC bulk substrate. It is noted that an n-type or p-type SiC layer can be grown by supplying a dopant gas if necessary.

Then, the annealing of the substrate is stopped, the supply of the silane gas and the propane gas is stopped, and the substrate is cooled in a hydrogen atmosphere. Since the cooling rate at this point is generally high, etching with hydrogen during the cooling of the substrate is negligible.

In the aforementioned method, the top face of a SiC bulk substrate can be prevented from being etched with hydrogen before the epitaxial growth, and therefore, even when a plurality of SiC layers are to be deposited, the top face and the interfaces between the SiC layers can be made flat.

-Examination of Method for Processing SiC Bulk Substrate-

In the aforementioned method, a SiC bulk substrate having a satisfactorily flat top face is preferably prepared. Therefore, the present inventors searched for a method for flattening the top face of a substrate, and thought of processing a substrate top face by utilizing the etching with hydrogen conversely. As a result of examination made by the present inventors under various conditions, it was found that the top face of a SiC bulk substrate or a grown SiC layer can be flattened by annealing the substrate in a hydrogen atmosphere at a pressure lower than the atmospheric pressure. This method will be described in and after Embodiment 5 below.

Embodiment 1

As Embodiment 1 of the invention, a SiC substrate including a plurality of SiC layers and a method for fabricating the same will be described.

Figure 1:
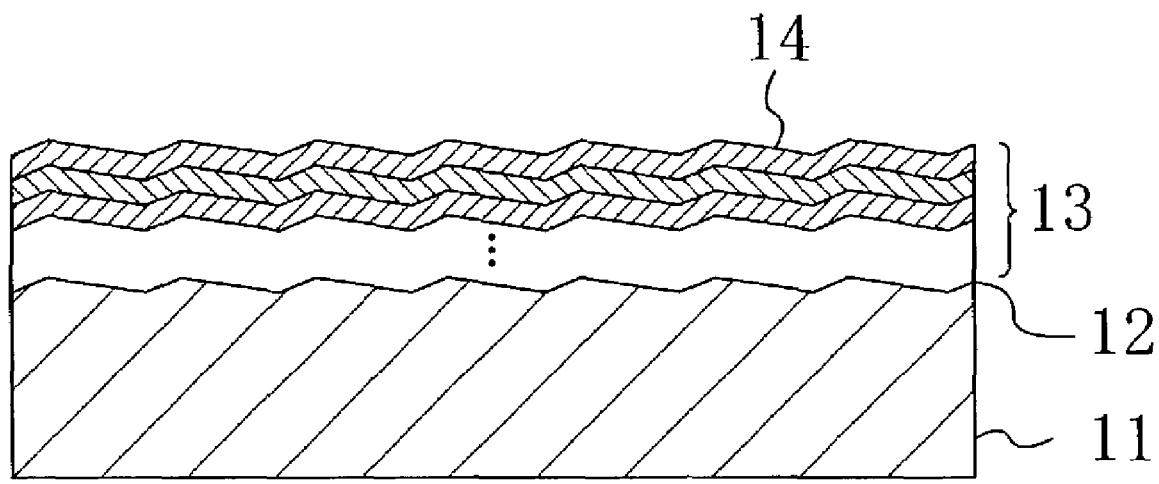
FIG. 1 is a cross-sectional view of a SiC substrate according to Embodiment 1 of the invention.

FIG. 1 is a cross-sectional view of the SiC substrate of this embodiment. As shown in FIG. 1, the SiC substrate of this embodiment includes a SiC bulk substrate 11 made from 4H—SiC and having a substantially flat substrate top face 12, and a multilayer part 13 with a thickness of approximately 3 $\mu$m epitaxially grown on the SiC bulk substrate 11. In the multilayer part 13, a δ-doped layer having a thickness of 10 nm and including nitrogen in a concentration of $1 \times 10^{18}$ atoms·cm$^{-3}$ and a low concentration doped layer having a thickness of 50 nm and including nitrogen in a concentration of $1 \times 10^{16}$ atoms·cm$^{-3}$ of less are alternately deposited. Also, the top face of the SiC bulk substrate 11 and the top face of each layer of the multilayer part 13 are substantially flat. It is noted that the substrate top face 12 has gentle irregularities with an average step height of approximately 3 nm.

Figure 19A:
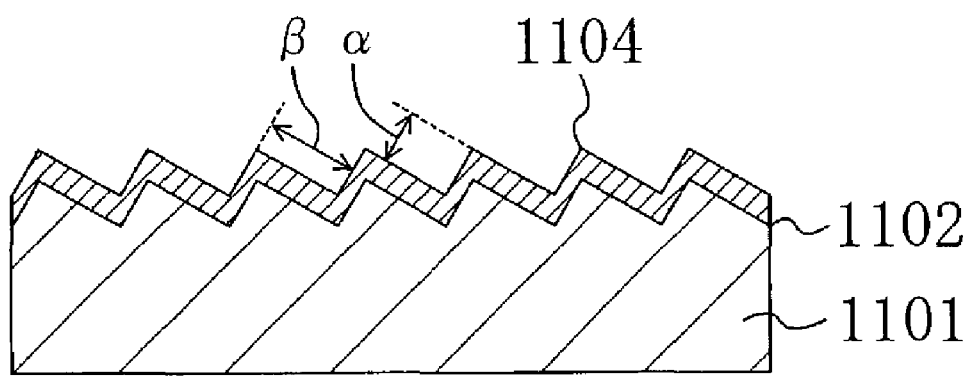
FIGS. 19A and 19B are cross-sectional views for explaining a method for fabricating a conventional SiC substrate having a SiC multilayered structure.
Figure 19B:
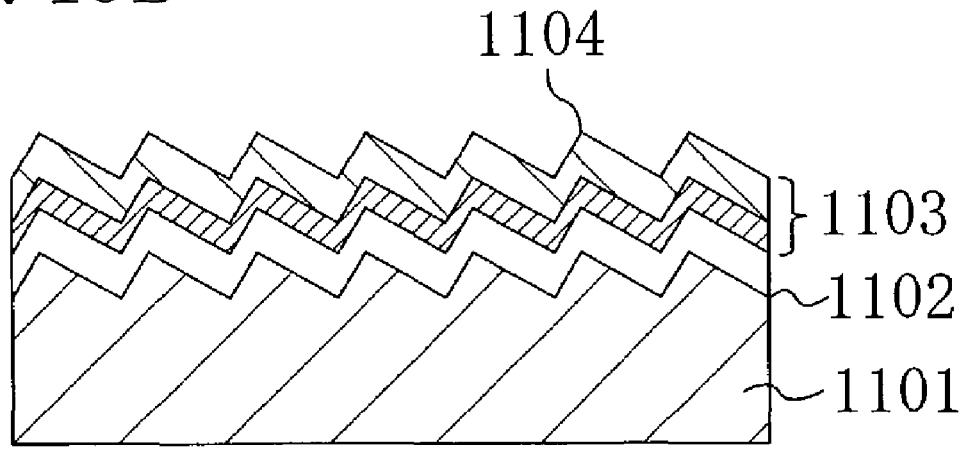
Figure 20:
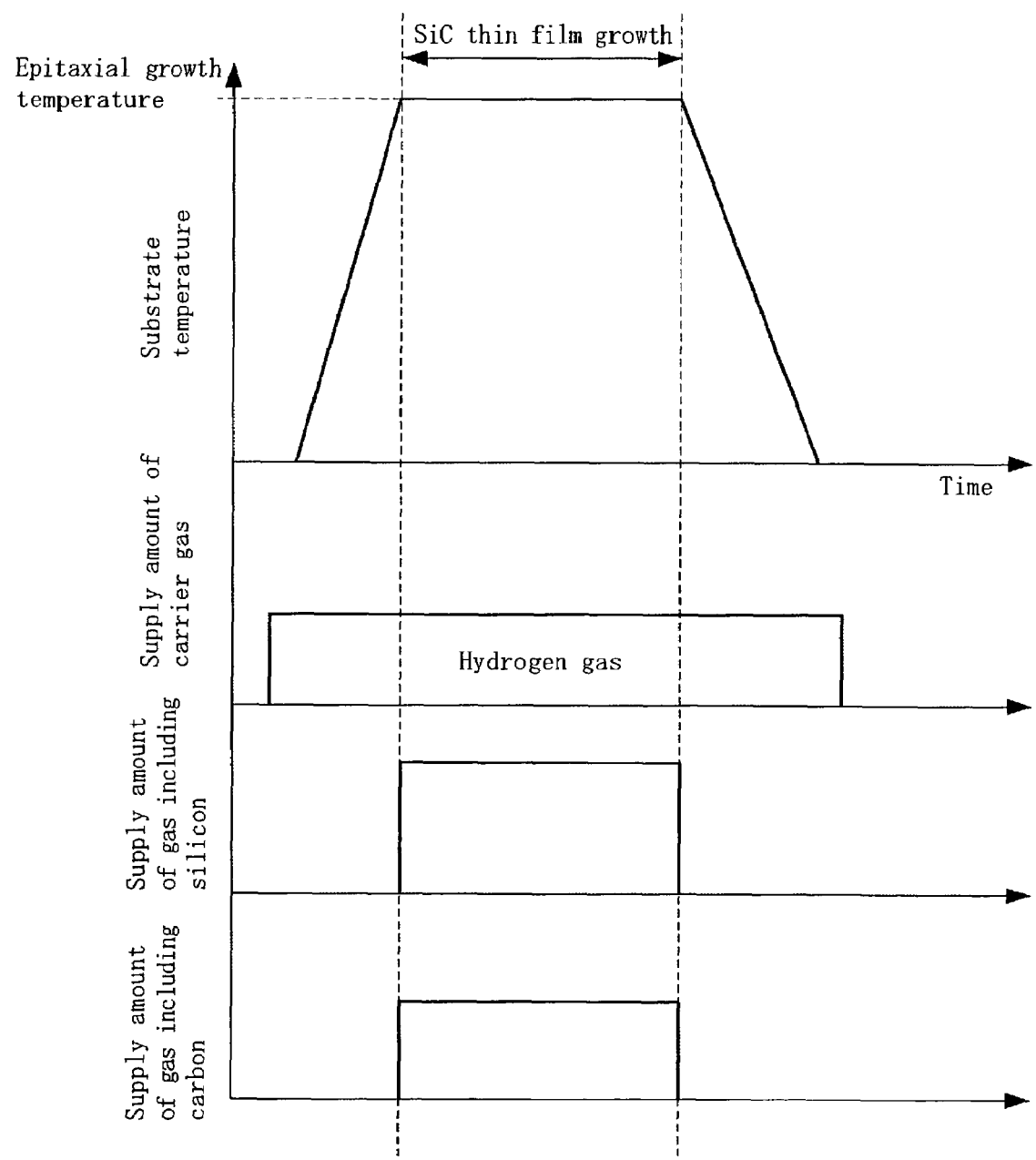
FIG. 20 is a diagram for showing change with time of a substrate temperature, a supply amount of carrier gas and a supply amount of material gas during epitaxial growth of a conventional SiC film.

As a characteristic of the SiC substrate of this embodiment, the SiC substrate has a δ-doped multilayered structure and the irregularities on the interfaces between the respective SiC layers and on the top face are flattened. Therefore, when the SiC substrate of this embodiment is used for a semiconductor device, the semiconductor device can attain a higher operation speed or a higher breakdown voltage as compared with the case where the conventional SiC substrate shown in FIG. 19B is used.

Now, a method for fabricating the SiC substrate of this embodiment will be described.

First, as the SiC bulk substrate 11 shown in FIG. 1, a 4H—SiC substrate having, as a principal plane, a plane inclined from the (0001) plane by an off angle of 8 degrees in the [11-20] direction is used. The substrate used herein has a diameter of 50 mm and n-type conductivity.

This SiC bulk substrate is placed in the reactor 300 to be set within the susceptor 302 of the vertical thin film growth system of FIG. 17. The pressure within the susceptor 302 is reduced to the level of $10^{-6}$ Pa. Next, argon is supplied as the carrier gas 306 at a flow rate of 0.5 L/min. from the gas supply system 308, so as to increase the pressure within the susceptor 302 to 90 kPa. The pressure within the susceptor 302 is controlled by adjusting the valve 311.

Then, with the flow rate of the argon kept, high frequency power of approximately 20.0 kHz at 10 kW is applied to the coil 304 with an induction heating apparatus, so as to heat the susceptor 302. As a result of this procedure, the SiC bulk substrate 11 (i.e., the substrate 301) is annealed, so that the substrate temperature can increase from the room temperature to 1000° C. in approximately 8 minutes and to 1200° C. in another several minutes.

When the substrate temperature thus reaches 1200° C., a silane gas serving as the material gas 305 of Si is supplied from the gas supply system 308 together with the argon, so as to place the substrate in an atmosphere including Si. At this point, the flow rates of the silane gas and the argon are respectively 1 mL/min. and 100 mL/min. Under this condition, the SiC bulk substrate is continuously annealed, so that the substrate temperature can increase to 1600° C., that is, the epitaxial growth temperature. Through this procedure, the formation of macro steps on the top face of the SiC bulk substrate can be suppressed.

Next, the high frequency power applied to the coil is controlled so as to make the temperature of the SiC bulk substrate 11 constant at 1600° C. At this point, the carrier gas is changed from the argon to a hydrogen gas used for the epitaxial growth, and the hydrogen gas is supplied to the susceptor 302 at a flow rate of 2 L/min. At the same time, a propane gas serving as the material gas 305 of carbon (C) and the silane gas serving as the material gas 305 of Si are supplied from the gas supply system 308 to the susceptor 302 at flow rates of 2 mL/min. and 3 mL/min., respectively. Each of the propane gas and the silane gas is diluted with a hydrogen gas at a flow rate of 50 mL/min. to be supplied. The pressure within the chamber is set to $1.0 \times 10^5$ Pa (1 atm.).

Through this procedure, a multilayer part 13 having a thickness of 3 $\mu$m and including a plurality of SiC layers are epitaxially grown on the SiC bulk substrate 11. In this case, the growth time is 1 hour.

During the epitaxial growth of the SiC layers, nitrogen serving as an n-type dopant is intermittently supplied, so that a δ-doped layer including nitrogen in a concentration of $1 \times 10^{18}$ atoms·cm$^{-3}$ and having a thickness of 10 nm and a low concentration doped layer including nitrogen in a concentration of $1 \times 10^{16}$ atoms·cm$^{-3}$ or less and having a thickness of 50 nm can be alternately deposited in the multilayer part 13.

In the aforementioned manner, the SiC substrate of this embodiment is fabricated.

The shape of the top face of the multilayer part 13 grown on the SiC bulk substrate 11 in the aforementioned manner was observed with a laser microscope and an interatomic force microscope (AFM). As a result, it was confirmed that the top face of the multilayer part 13 is flat with macro steps formed on the top face of the conventional SiC substrate eliminated. Also, it was found through evaluation with an AFM of the shape of the top face of the multilayer part 13 that the average step height is 3 nm. Furthermore, the multilayered structure including the δ-doped layer and the lower concentration doped layer was observed in the multilayer part 13, and it was confirmed that the average step height of irregularities is approximately 3 nm also on the interface between these layers.

Also, on the basis of the observation with the AFM, it was confirmed that the step height on the top face of the SiC substrate can be controlled by adjusting the conditions such as the temperature at which the supply of the silane gas is started and the flow rates of the silane gas and the argon.

Next, the present inventors performed a test for evaluating the electric characteristics of the SiC substrate of this embodiment.

First, the SiC substrate of this embodiment and a conventional SiC substrate used for comparison were prepared. The structure of the conventional SiC substrate was the same as that of the SiC substrate of this embodiment.

Next, with four ohmic electrodes provided on each SiC substrate, a hole measurement was performed so as to measure carrier mobility. As a result, it was found that the carrier mobility in the multilayer part 13 of the SiC substrate of this embodiment is not less than 1.2 times as high as that in the multilayer part 1103 of the conventional SiC substrate.

Furthermore, SiC substrates in which the step heights were respectively different were prepared by the method of this embodiment, and the hole measurement was performed on these substrate. As a result, it was found that when the average step height is 30 nm or less, the carrier mobility is higher than that in the multilayer part 1103 of the conventional SiC substrate. Similarly, it was found that when the average step height is 10 nm or less, the carrier mobility is not less than 1.2 times as high as that in the multilayer part 1103 of the conventional SiC substrate.

On the basis of the measurement results, it is found that when the multilayer part 13 of the SiC substrate of this embodiment is used as a channel region, a semiconductor device with a high operation speed can be fabricated.

In this embodiment, a 4H—SiC substrate having a principal plane inclined at an off angle of 8 degrees in the [11-20] direction is used as the SiC bulk substrate. Instead, a substrate having any of the following planes may be used: The β-SiC (111) plane, the α-SiC (0001) plane of 6H—SiC or 4H—SiC, the Si plane of 15R—SiC, or an offcut plane with an off angle of 10 degrees or less of any of these planes; and the β-SiC (111) plane, the α-SiC (1-100) plane of 6H—SiC or 4H—SiC, the Si plane such as the α-SiC (11-20) plane, or an offcut plane with an off angle of 15 degrees or less of any of these planes. Since SiC can be more easily epitaxially grown on the Si plane of SiC crystal such as the α-SiC (0001) plane of 6H—SiC or 4H—SiC than on the C (carbon) plane, a substrate having such a Si plane as the principal plane is preferably used as a substrate for a device.

Although the formation of macro steps may be suppressed even on a substrate inclined at an off angle out of the aforementioned range by employing the present method, when such a substrate is used, the conditions are difficult to control and hence irregularities may be formed on the substrate top face.

In the method for fabricating a SiC substrate of this embodiment, the top face of a SiC bulk substrate is prevented from being etched during the temperature increase, but existing irregularities on the SiC bulk substrate cannot be flattened. Therefore, the SiC bulk substrate first prepared preferably has a top face as flat as possible. When the method of this embodiment is applied to a SiC bulk substrate whose top face has been previously flattened, a SiC substrate having good electric characteristics can be fabricated more definitely. The method for flattening a top face of a substrate will be described in another embodiment described below.

Furthermore, although the SiC substrate having the δ-doped multilayered structure is described in this embodiment, a SiC substrate in which each SiC layer has a thickness exceeding 10 nm can be fabricated. Also in this case, the resultant substrate can attain better electric characteristics than a SiC substrate fabricated by the conventional method.

Moreover, although nitrogen is introduced as a dopant for forming the δ-doped multilayered structure in the method for fabricating a SiC substrate of this embodiment, nitrogen may be replaced with phosphorus (P) or a p-type dopant such as boron and aluminum (Al) may be introduced instead.

Figure 18:
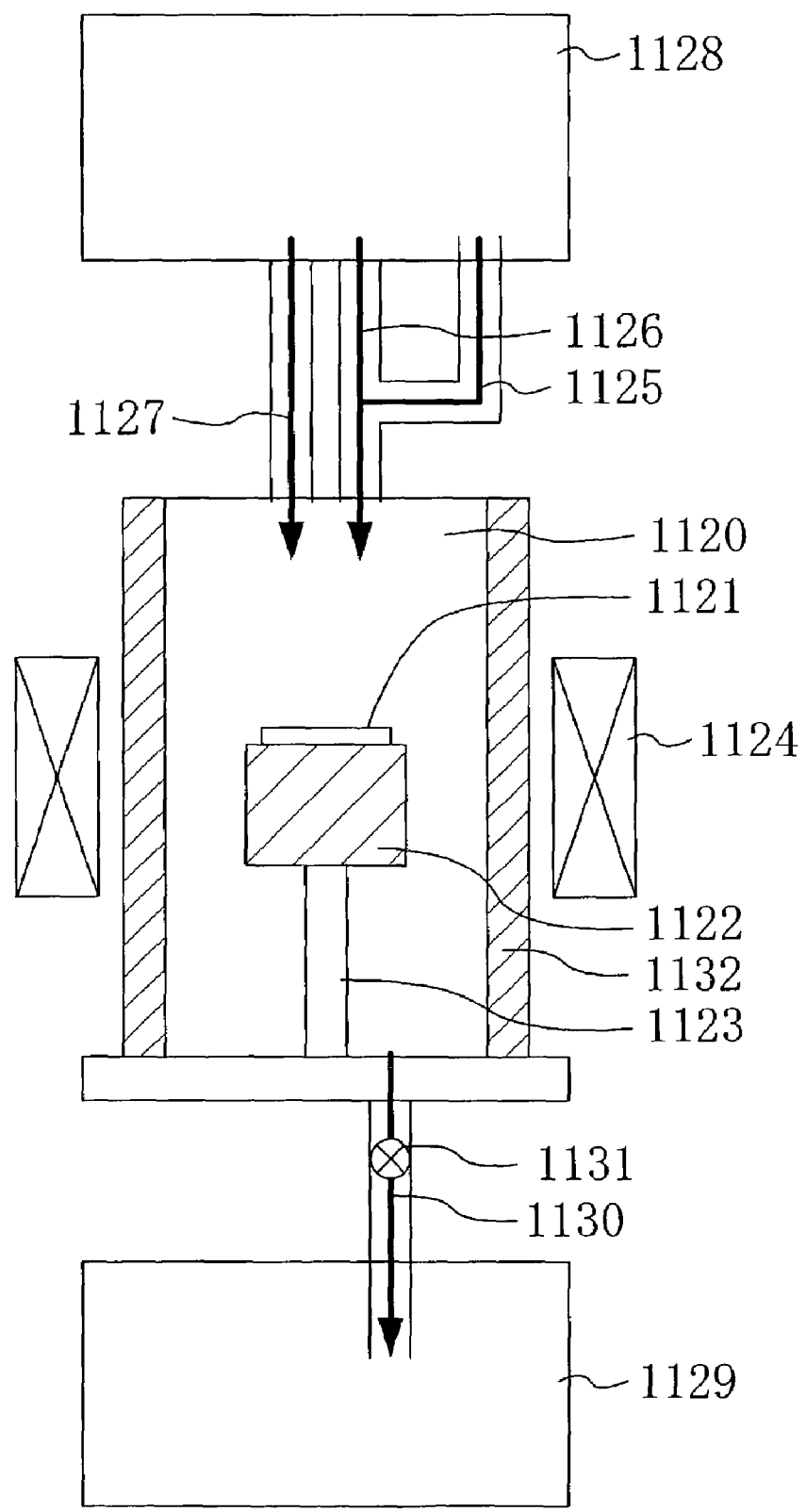
FIG. 18 is a schematic diagram of a general vertical thin film growth system.

Although the vertical thin film growth system of FIG. 17 is used in the method of this embodiment, the general vertical thin film growth system of FIG. 18 may be used instead.

Also, the inert gas used in the method of this embodiment may be helium, neon or the like instead of argon. Furthermore, the material gas of Si may be any of silane gases such as a monosilane ($SiH_4$) gas or a methylsilane gas ($SiCH_6$), or any stable gas including chlorine (Cl) in addition to Si and H in a molecule, such as a chlorosilane gas. Alternatively, a highly reactive gas including Si in a molecule, such as disilane ($Si_2H_6$), may be used. Among these material gases of Si, monosilane is preferred because it has an advantage of including a small amount of dopants.

Moreover, although the propane gas is used as the material gas of carbon for the epitaxial growth of SiC in this embodiment, another hydrocarbon gas such as a methane gas or an acetylene gas may be used instead.

Although the inert gas is used as the carrier gas during the temperature increase of the SiC bulk substrate in the method of this embodiment, hydrogen may be used as the carrier gas instead. Specifically, in order to prevent a substrate top face from being etched with hydrogen, it is indispensable to supply the material gas of Si within a temperature region from 1200° C. to the epitaxial growth temperature but it is not always indispensable to increase the substrate temperature in an inert gas atmosphere. In this case, there is no need to change the carrier gas at the time of starting the epitaxial growth.

Although SiC is used as the substrate in this embodiment, the substrate may be a SiGe or SiGeC substrate with an off angle, or a substrate of a group III-V semiconductor, such as GaN, GaAs, InP and InAs, with an off angle.

In this case, assuming that an element having, as a simple body, the lowest melting point among elements constituting the used semiconductor substrate is designated as an element X, the formation of macro steps on the substrate top face can be prevented by supplying the material of the element X during increase of the substrate temperature. At this point, the material of the element X is started to be supplied in a temperature range from a temperature lower than the melting point of the element X by a given temperature to the epitaxial growth temperature.

For example, in the case where a GaAs layer is to be epitaxially grown on a GaAs substrate, the material gas of As is started to be supplied at a temperature of 620° C., which is lower than the melting point of As (namely, 817° C.) by 200° C. It is noted that in growing such a compound semiconductor, the material may be in a liquid phase instead of a gas phase.

Embodiment 2

As Embodiment 2 of the invention, a Schottky diode fabricated by using the SiC substrate of Embodiment 1 will be described.

Figure 3A:
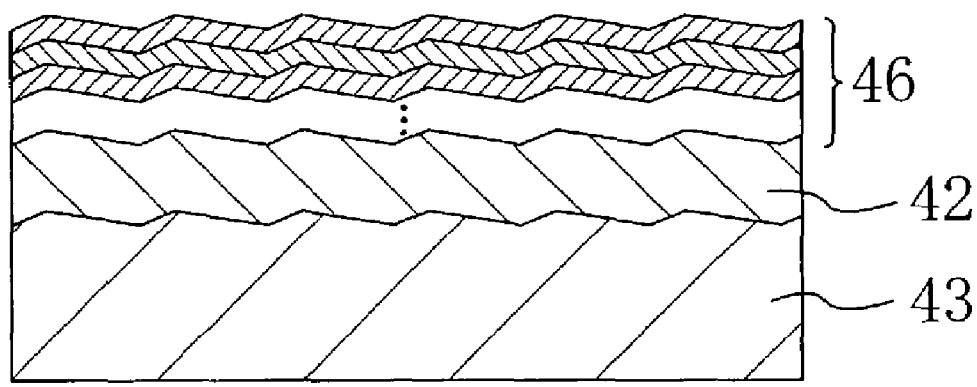
FIGS. 3A and 3B are cross-sectional views for explaining a Schottky diode according to Embodiment 2 of the invention and procedures for fabricating the Schottky diode.
Figure 3B:
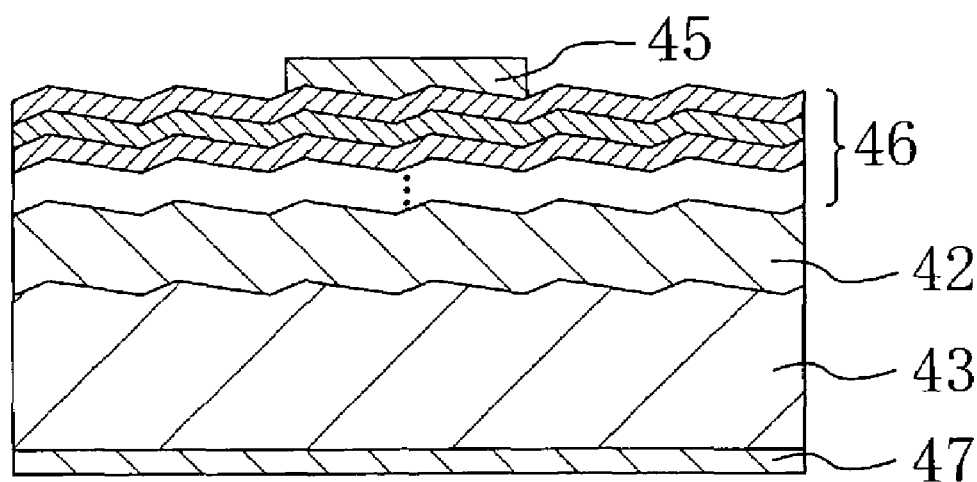

FIGS. 3A and 3B are cross-sectional views for showing a method for fabricating the Schottky diode of this embodiment.

As shown in FIG. 3B, the Schottky diode fabricated by the method of this embodiment includes a SiC bulk substrate 43 of n-type 4H—SiC including nitrogen, an n-type doped layer 42 made from SiC epitaxially grown on the principal plane of the SiC bulk substrate 43 and having a thickness of 10 μm, a multilayer part 46 made from SiC epitaxially grown on the n-type doped layer 42 and having a thickness of 300 nm, a Schottky electrode 45 of Ni provided on the multilayer part 46, and an ohmic electrode 47 of Ni provided on a face opposing the principal plane of the SiC bulk substrate 43 (hereinafter simply referred to as the reverse face). The concentrations of the nitrogen included in the SiC bulk substrate 43 and the n-type doped layer 42 are respectively $1 \times 10^{18}$ atoms·cm$^{-3}$ and $1 \times 10^{16}$ atoms·cm$^{-3}$. Also, in the multilayer part 46, a δ-doped layer including nitrogen in a concentration of $1 \times 10^{18}$ atoms·cm$^{-3}$ and having a thickness of 10 nm and a low concentration doped layer including nitrogen in a concentration of $1 \times 10^{16}$ atoms·cm$^{-3}$ or less and having a thickness of 50 nm are alternately deposited by five layers each. Also, the uppermost face of the multilayer part 46 corresponds to the low concentration doped layer.

As a characteristic of the Schottky diode of this embodiment, the top faces of the SiC bulk substrate 43 and the multilayer part 46 and the interfaces between the respective layers included in the multilayer part 46 are all substantially flat as shown in FIG. 3B. The average step height of irregularities on the top faces of the SiC bulk substrate 43 and the multilayer part 46 and on the interfaces between the layers included in the multilayer part 46 is 3 nm.

Now, the method for fabricating the Schottky diode of this embodiment will be described.

First, in a procedure shown in FIG. 3A, a SiC bulk substrate 43 is prepared. As the SiC bulk substrate 43, a 4H—SiC substrate having, as a principal plane, a plane inclined at an off angle of 8 degrees from the (0001) plane in the [11-20] direction is used. This SiC bulk substrate 43 has n-type conductivity and a carrier concentration of $1\times10^{18}$ atoms·cm$^{-3}$.

Next, the SiC bulk substrate 43 is placed in the susceptor 302 of the vertical thin film growth system of FIG. 17, and the pressure within the susceptor 302 is reduced to the level of $10^{-6}$ Pa. Then, argon is supplied as the carrier gas 306 from the gas supply system 308 at a flow rate of 0.5 L/min., so as to increase the pressure within the susceptor 302 to 90 kPa.

Thereafter, with the flow rate of the argon kept, high frequency power of approximately 20.0 kHz at 10 kW is applied to the coil 304 with an induction heating apparatus, so as to heat the susceptor 302. Thus, the substrate is annealed.

When the substrate temperature reaches 1200° C., a silane gas serving as the material gas 305 of Si is supplied from the gas supply system 308 together with the argon, so that the substrate can be kept in an atmosphere including Si. At this point, the flow rates of the silane gas and the argon are respectively 1 mL/min. and 100 mL/min. Under this condition, the SiC bulk substrate 43 is continuously annealed until the substrate temperature reaches 1600° C., that is, the epitaxial growth temperature. Through this procedure, the formation of macro steps on the top face of the SiC bulk substrate 43 can be suppressed. The procedures up to this point are the same as those of Embodiment 1.

Next, the high frequency power applied to the coil is controlled so that the temperature of the SiC bulk substrate 43 can be constant at 1600° C. At this point, the carrier gas is changed from the argon to a hydrogen gas for use in the epitaxial growth, and the hydrogen gas is supplied to the susceptor 302 at a flow rate of 2 L/min. At the same time, a propane gas serving as the material gas 305 of carbon (C), the silane gas serving as the material gas 305 of Si and a nitrogen gas serving as the dopant gas 307 are supplied from the gas supply system 308 to the susceptor 302 respectively at flow rates of 2 mL/min., 3 mL/min. and 0.1 mL/min. Each of the propane gas and the silane gas is diluted with a hydrogen gas at a flow rate of 50 mL/min. to be supplied. The pressure within the chamber is set to $1.0\times10^5$ Pa (1 atm.). Thus, an n-type doped layer 42 of SiC with a thickness of 10 $\mu$m is formed on the SiC bulk substrate 43. The concentration of the carrier (nitrogen) included in the n-type doped layer 42 is $1\times10^{16}$ atoms·cm$^{-3}$.

Then, with the flow rates of the propane gas and the silane gas kept, a nitrogen gas is intermittently supplied, so as to form a multilayer part 46 with a thickness of 300 nm on the n-type doped layer 42. In the multilayer part 46, a δ-doped layer including nitrogen in a concentration of $1\times10^{18}$ atoms·cm$^{-3}$ and having a thickness of 10 nm and a low concentration doped layer including nitrogen in a concentration of $1\times10^{16}$ atoms·cm$^{-3}$ or less and having a thickness of 50 nm are alternately deposited by five layers each. The uppermost face of the multilayer part 46 corresponds to the low concentration doped layer.

When the shape of the top face of the multilayer part 46 formed in this manner was evaluated with an AFM, it was found that the average step height is 3 nm. Also, it was confirmed that the top face of the SiC bulk substrate and the interfaces between the respective layers of the multilayer part 46 are substantially flat similarly to the top face of the multilayer part 46.

Next, in a procedure shown in FIG. 3B, nickel (Ni) is deposited on the reverse face of the SiC bulk substrate 43 by using a vacuum evaporation system. Subsequently, in order to obtain ohmic contact, the substrate is annealed for 3 minutes at 1000° C., and an ohmic electrode 47 is formed on the reverse face of the SiC bulk substrate 43.

Subsequently, Ni is deposited on the top face of the multilayer part 46 so as to form a Schottky electrode 45. In this manner, the Schottky diode of this embodiment is fabricated.

The results of examination of the current-voltage characteristic of the Schottky diode of this embodiment will now be described.

For comparison, a Schottky diode using a substrate fabricated by a conventional method (which is designated as the "conventional Schottky diode" in the description of this embodiment) was fabricated, and its current-voltage characteristic was also examined together with that of the Schottky diode of this embodiment.

Figure 21A:
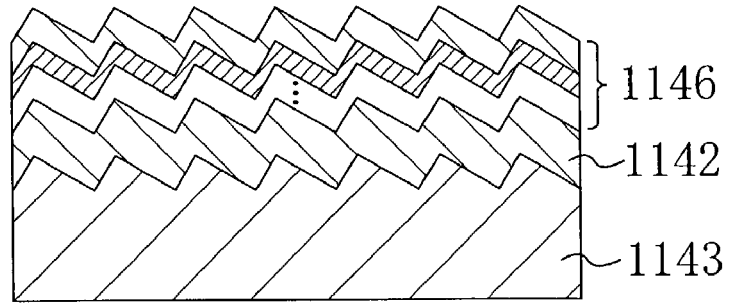
FIGS. 21A, 21B and 21C are cross-sectional views for respectively showing a substrate portion of a conventional Schottky diode, a substrate portion of a conventional MESFET and a substrate portion of a conventional vertical MOSFET.

FIG. 21A is a cross-sectional view of a substrate portion of the conventional Schottky diode. As shown in FIG. 21A, the structure of the conventional Schottky diode, such as the thicknesses of an n-type doped layer 1142 and a multilayer part 1146 and the dopant concentrations in the respective layers, is the same as that of the Schottky diode of this embodiment.

A reverse bias voltage was applied to each Schottky diode, so as to measure a reverse breakdown voltage at which breakdown occurs. As a result, it was found that the breakdown voltage is 150 V in the conventional Schottky diode and is 600 V or more in the Schottky diode of this embodiment. In other words, it was found that the Schottky diode of this embodiment has a breakdown voltage property improved by four times or more as compared with the conventional Schottky diode.

It seems that the breakdown voltage of the Schottky diode of this embodiment is largely increased because a leakage current derived from the macro steps is reduced. Specifically, in the Schottky diode of this embodiment, the top face of the multilayer part 46 and the interfaces in the multilayer part 46 are flattened, which seems to prevent electric field collection on the top face and the interfaces between the respective layers so as to increase the breakdown voltage. Also, since the δ-doped multilayered structure having the low concentration doped layer as the uppermost face is in contact with the Schottky electrode, a depletion layer expands substantially parallel to the top face under application of reverse bias voltage. This seems to reduce also the electric field collection on the interface between the Schottky diode and the multilayer part so as to remarkably increase the breakdown voltage. On the basis of these examination, it is understood that the Schottky diode of this embodiment can attain a breakdown voltage as high as 600 V even when it does not include a guard ring structure generally necessary.

Furthermore, the fabrication conditions were varied so as to fabricate various Schottky diodes including SiC layers in which the heights of steps on the top face and the interfaces were respectively different, and the breakdown voltages of the respective Schottky diodes were measured. As a result, it was confirmed that when the average step height (of irregularities) on the top face of the multilayer part 46 and on the interfaces in the multilayer part 46 exceeds 30 nm, the breakdown voltage abruptly lowers.

As a result, it was found that a Schottky diode having an advantage of a high breakdown voltage can be fabricated by flattening the interfaces between respective layers included in the δ-doped multilayered structure and the top face.

Although the dopant included in the SiC bulk substrate 43, the n-type doped layer 42 and each layer of the multilayer part 46 is nitrogen in this embodiment, another n-type dopant such as As may be used or a p-type dopant such as boron or phosphorus may be used instead.

Also, a Schottky diode is fabricated in this embodiment, but a pn diode may be fabricated by forming p-type and n-type doped layers on the SiC bulk substrate 43 by a similar method.

Although the Schottky diode of this embodiment includes one multilayer part 46, a plurality of multilayer parts may be deposited in the Schottky diode.

Although the substrate portion of the Schottky diode of this embodiment is made from SiC, the bulk substrate, the n-type doped layer and the multilayer part may be made from another semiconductor such as GaN, GaAs, InP, SiGe or SiGeC.

Embodiment 3

As Embodiment 3 of the invention, a MESFET fabricated by using the SiC substrate of Embodiment 1 will be described.

Figure 4A:
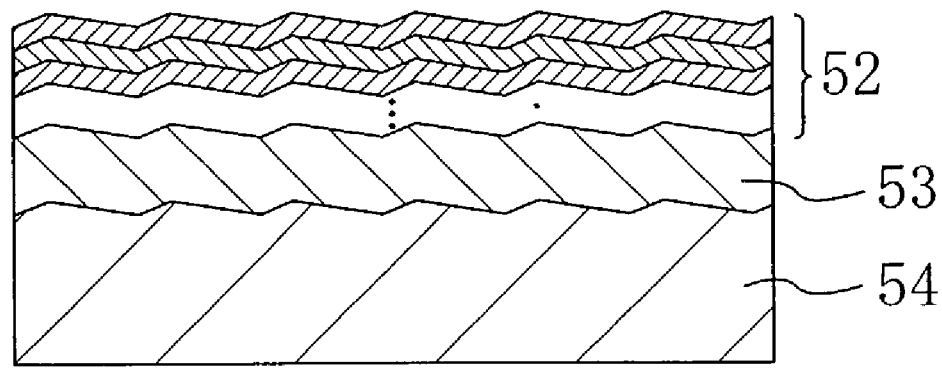
FIGS. 4A and 4B are cross-sectional views for explaining a MESFET according to Embodiment 3 of the invention and procedures for fabricating the MESFET.
Figure 4B:
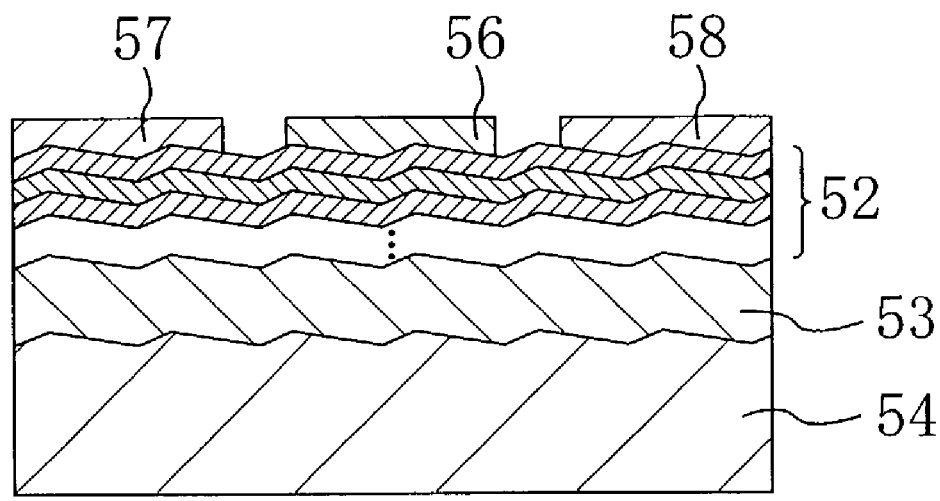

FIGS. 4A and 4B are cross-sectional views for showing a method for fabricating the MESFET of this embodiment.

As shown in FIG. 4B, the MESFET fabricated by the method of this embodiment includes a SiC bulk substrate 54 of 4H—SiC, an undoped layer 53 with a thickness of 3 μm of SiC epitaxially grown on the SiC bulk substrate 54, a multilayer part 52 with a thickness of 300 nm of SiC epitaxially grown on the undoped layer 53, a gate electrode 56 of Ni provided on the multilayer part 52 and having a gate length of approximately 0.5 μm, and a source electrode 57 and a drain electrode 58 of Ni provided on the multilayer part 52 with the gate electrode sandwiched therebetween. The multilayer part 52 has a structure in which a δ-doped layer including nitrogen in a concentration of $1\times10^{18}$ atoms·cm$^{-3}$ and having a thickness of 10 nm and a low concentration doped layer including nitrogen in a concentration of $1\times10^{16}$ atoms·cm$^{-3}$ or less and having a thickness of 50 nm are alternately deposited by five layers each. The uppermost face of the multilayer part 52 corresponds to the low concentration doped layer.

As shown in FIG. 4B, as a characteristic of the MESFET of this embodiment, the top faces of the SiC bulk substrate 54 and the multilayer part 52 and interfaces between the respective layers included in the multilayer part 52 are all substantially flat. The average step height of irregularities formed on the top faces of the SiC bulk substrate 54 and the multilayer part 52 and on the interfaces between the respective layers included in the multilayer part 52 is 3 nm.

Now, the method for fabricating the MESFET of this embodiment will be described.

First, in a procedure shown in FIG. 4A, a SiC bulk substrate 54 is prepared. As the SiC bulk substrate 54, a 4H—SiC substrate having, as a principal plane, a plane inclined at an off angle of 8 degrees from the (0001) plane in the [11-20] direction is used.

Next, the SiC bulk substrate 54 is placed in the susceptor 302 of the vertical thin film growth system of FIG. 17, and the pressure within the susceptor 302 is reduced to the level of $10^{-6}$ Pa. Then, argon is supplied at a flow rate of 0.5 L/min. as the carrier gas 306 from the gas supply system 308, so as to increase the pressure within the susceptor 302 to 90 kPa.

Then, with the flow rate of the argon kept, high frequency power of approximately 20.0 kHz at 10 kW is applied to the coil 304 with an induction heating apparatus, so as to heat the susceptor 302. Thus, the substrate is annealed.

When the substrate temperature reaches 1200° C., a silane gas serving as the material gas 305 of Si is supplied from the gas supply system 308 together with the argon, so as to place the substrate in an atmosphere including Si. At this point, the flow rates of the silane gas and the argon are respectively 1 mL/min. and 100 mL/min. Under this condition, the SiC bulk substrate 54 is continuously annealed until the substrate temperature reaches 1600° C., that is, the epitaxial growth temperature. Through this procedure, the formation of macro steps on the top face of the SiC bulk substrate 54 is suppressed. The procedures up to this point are the same as those of Embodiments 1 or 2.

Next, with the temperature of the SiC bulk substrate 54 kept at 1600° C., the carrier gas is changed from the argon to a hydrogen gas used for the epitaxial growth, and the hydrogen gas is supplied at a flow rate of 2 L/min. to the susceptor 302. At the same time, a propane gas serving as the material gas 305 of carbon and the silane gas serving as the material gas 305 of Si are supplied to the substrate within the susceptor 302 respectively at flow rates of 2 mL/min. and 3 mL/min. Each of the propane gas and the silane gas is diluted with a hydrogen gas at a flow rate of 50 mL/min. to be supplied.

Thus, an undoped layer of SiC with a thickness of 3 μm is formed on the SiC bulk substrate 54. The pressure within the chamber in growing the SiC film is set to $1.0\times10^5$ Pa (1 atm; atmospheric pressure).

Subsequently, with the aforementioned conditions kept, a nitrogen gas is intermittently supplied as a dopant, so as to form a multilayer part 52 with a thickness of 300 nm on the undoped layer. In this multilayer part 52, a δ-doped layer including nitrogen in a concentration of $1\times10^{18}$ atoms·cm$^{-3}$ and having a thickness of 10 nm and a low concentration doped layer including nitrogen in a concentration of $1\times10^{16}$ atoms·cm$^{-3}$ or less and having a thickness of 50 nm are alternately deposited by five layers each. The uppermost face of the multilayer part 52 corresponds to the low concentration doped layer.

When the shape of the top face of the multilayer part 52 formed in the aforementioned manner was evaluated by using an AFM, it was found that the average step height is 3 nm. Also, it was confirmed that the top face of the SiC bulk substrate and the interfaces between the respective layers of the multilayer part 52 are substantially flat similarly to the top face of the multilayer part 52.

Next, in a procedure shown in FIG. 4B, Ni is deposited on the top face of the multilayer part 52 by using a vacuum evaporation system. Thereafter, the substrate is annealed for 3 minutes at 1000° C. for obtaining ohmic contact, so as to form a source electrode 57 and a drain electrode 58 on the multilayer part 52. Thereafter, Ni is deposited on an exposed portion of the top face of the multilayer part 52 for obtaining Schottky contact. Thus, a gate electrode 56 is formed on the multilayer part 52 in a portion sandwiched between the source electrode 57 and the drain electrode 58. The source electrode and the drain electrode are respectively spaced from the gate electrode. In this manner, the MESFET of this embodiment is fabricated.

The results of examination of the current-voltage characteristic of the MESFET of this embodiment will now be described.

For comparison, a MESFET including a substrate fabricated by a conventional method (which is designated as the "conventional MESFET" in the description of this embodiment) was fabricated, and its current-voltage characteristic was also examined together with that of the MESFET of this embodiment.

Figure 21B:
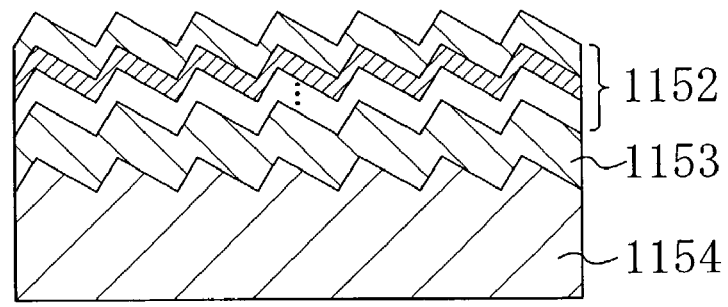

FIG. 21B is a cross-sectional view of a substrate portion of the conventional MESFET. As shown in FIG. 21B, the structure of the conventional MESFET, such as the thicknesses of an undoped layer 1153 and a multilayer part 1152, the dopant concentrations in respective layers and the size of each electrode, is the same as that of the MESFET of this embodiment.

In order to compare the performances of these MESFETs, mutual conductance in the vicinity of the threshold voltage was measured. As a result, it was found that the MESFET of this embodiment has mutual conductance nearly twice as high as that of the conventional MESFET. The reason seems to be as follows:

First, in the conventional MESFET, since there are macro steps on the top face and on the interfaces between layers of the multilayer part 1152 serving as the channel, the movement of carriers is prevented, which seems to lower the carrier mobility. In contrast, in the MESFET of this embodiment, since the top face of the multilayer part 52 and the interfaces between the layers of the multilayer part 52 are all flattened, the movement of carriers leached from the δ-doped layer is not prevented, and hence, the carrier mobility seems to be large. This is applied to not only the MESFET but also a MESFET or a bipolar transistor in which a current flows in a lateral direction (i.e., a direction parallel to the substrate face).

Furthermore, the fabrication conditions were varied so as to fabricate MESFETs including SiC layers in which the step heights on the top face and the interfaces were respectively different, and the mutual conductance of the respective MESFETs were measured. As a result, it was confirmed that when the average step height on the top face of the multilayer part 52 and the interfaces in the multilayer part 52 is 30 nm or less, the mutual conductance is sufficiently higher than that of the conventional MESFET.

As a result, it was found that a MESFET with a high gain and a high operation speed can be fabricated by flattening the top face and the interfaces of respective layers in the multilayer part 52 serving as the channel. In other words, a MESFET capable of making an advantage of the δ-doped multilayered structure can be thus fabricated.

Although the SiC substrate is used in the MESFET of this embodiment, the bulk substrate, the undoped layer and the multilayer part may be made from another semiconductor such as GaN, GaAs, InP, SiGe or SiGeC.

It is noted that in a MESFET fabricated by the method of this embodiment, the carriers may move in a direction parallel to the steps formed on the multilayer part 52. Thus, the operation speed of the MESFET can be further improved.

Embodiment 4

As Embodiment 4 of the invention, a vertical MOSFET fabricated by using the SiC substrate of Embodiment 1 will be described.

Figure 5A:
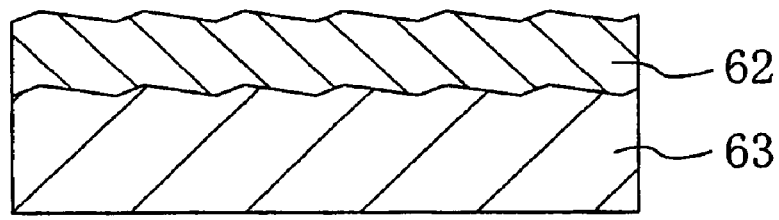
FIGS. 5A, 5B and 5C are cross-sectional views for explaining a vertical MOSFET according to Embodiment 4 of the invention and procedures for fabricating the vertical MOSFET.
Figure 5B:
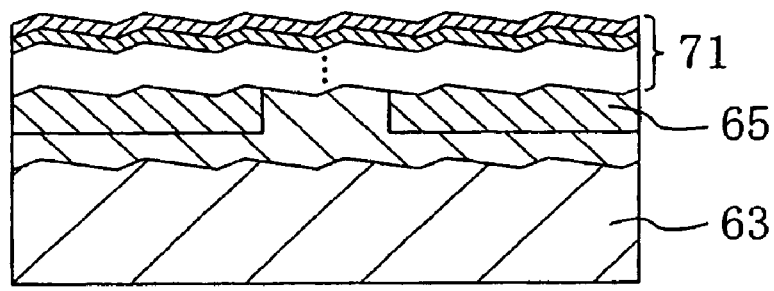
Figure 5C:
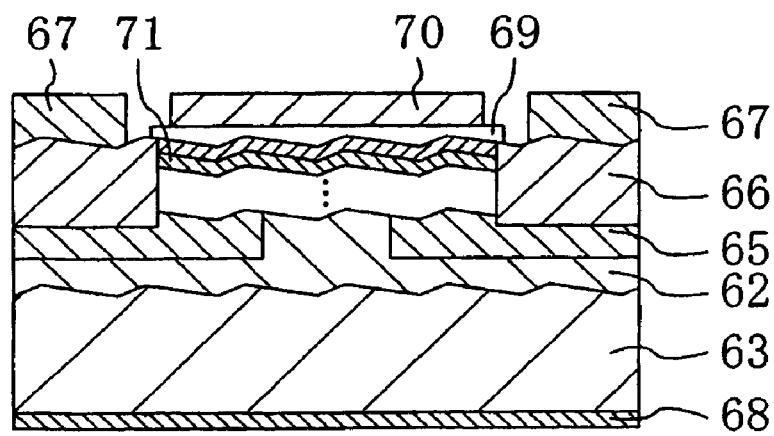

FIGS. 5A through 5C are cross-sectional views for showing a method for fabricating the vertical MOSFET of this embodiment.

As shown in FIG. 5C, the vertical MOSFET fabricated by the method of this embodiment includes a SiC bulk substrate 63 of 4H—SiC, an n-type doped layer 62 with a thickness of 10 μm of SiC epitaxially grown on the SiC bulk substrate 63, a p-type well 65 formed by implanting aluminum ions into portions of the n-type doped layer 62, a multilayer part 71 with a thickness of 300 nm of SiC epitaxially grown on the n-type doped layer 62, a gate insulating film 69 of $SiO_2$ provided on the multilayer part 71, a gate electrode 70 of Ti provided on the gate insulating film 69 and having a gate length of 1 μm, an n-type well 66 provided in portions of the multilayer part 71 and the p-type well 65 on both sides of the gate electrode 70 and including nitrogen, a source electrode 67 of Ni provided on the n-type well 66, and a drain electrode 68 of Ni provided on a reverse face of the SiC bulk substrate 63. The multilayer part 71 has a structure in which a δ-doped layer including nitrogen in a concentration of $1 \times 10^{18}$ atoms·cm$^{-3}$ and having a thickness of 10 nm and a low concentration doped layer including nitrogen in a concentration of $1 \times 10^{16}$ atoms·cm$^{-3}$ or less and having a thickness of 50 nm are alternately deposited by five layers each. A portion of the n-type doped layer 62 excluding the p-type well 65 includes nitrogen, and the carrier concentration therein is $2 \times 10^{17}$ atoms·cm$^{-3}$. The carrier concentrations in the p-type well 65 and the n-type well 66 are respectively $1 \times 10^{16}$ atoms·cm$^{-3}$ and $1 \times 10^{18}$ atoms·cm$^{-3}$.

As shown in FIG. 5C, as a characteristic of the vertical MOSFET of this embodiment, the top faces of the SiC bulk substrate 63, the n-type doped layer 62 and the multilayer part 71 and interfaces between the respective layers included in the multilayer part 71 are all substantially flat. The average step height of irregularities formed on the top faces and the interfaces is 3 nm.

Now, the method for fabricating the vertical MOSFET of this embodiment will be described.

First, in a procedure shown in FIG. 5A, a SiC bulk substrate 63 is prepared. As the SiC bulk substrate 63, a 4H—SiC substrate having, as a principal plane, a plane inclined at an off angle of 8 degrees from the (0001) plane in the [11-20] direction is used.

Next, the SiC bulk substrate 63 is placed in the susceptor 302 of the vertical thin film growth system of FIG. 17, and the pressure within the susceptor 302 is reduced to the level of $10^{-6}$ Pa. Then, argon is supplied at a flow rate of 0.5 L/min. as the carrier gas 306 from the gas supply system 308, so as to increase the pressure within the susceptor 302 to 90 kPa.

Then, with the flow rate of the argon kept, high frequency power of approximately 20.0 kHz at 10 kW is applied to the coil 304 with an induction heating apparatus, so as to heat the susceptor 302. Thus, the substrate is annealed.

When the substrate temperature reaches 1200° C., a silane gas serving as the material gas 305 of Si is supplied from the gas supply system 308 together with the argon, so as to place the substrate in an atmosphere including Si. At this point, the flow rates of the silane gas and the argon are respectively 1 mL/min. and 100 mL/min. Under this condition, the SiC bulk substrate 63 is continuously annealed until the substrate temperature reaches 1600° C., that is, the epitaxial growth temperature. Through this procedure, the formation of macro steps on the top face of the SiC bulk substrate 63 is suppressed. The procedures up to this point are the same as any of those of Embodiments 1 through 3.

Then, in a procedure shown in FIG. 5B, aluminum ions are implanted into an n-type doped layer 62, and then, activation annealing is performed. Thus, a p-type well 65 with a carrier concentration of $1 \times 10^{16}$ atoms·cm$^{-3}$ is formed.

Next, with the substrate temperature kept at 1600° C., a hydrogen gas is supplied as the carrier gas at a flow rate of 2 L/min. At the same time, a propane gas serving as the material gas 305 of carbon and the silane gas serving as the material gas 305 of Si are supplied respectively at flow rates of 2 mL/min. and 3 mL/min, and a nitrogen gas is intermittently supplied. Thus, a multilayer part 71 of SiC with a thickness of 300 nm is formed on the n-type doped layer 62. In this multilayer part 71, a δ-doped layer including nitrogen in a concentration of $1 \times 10^{18}$ atoms·cm$^{-3}$ and having a thickness of 10 nm and a low concentration doped layer including nitrogen in a concentration of $1 \times 10^{16}$ atoms·cm$^{-3}$ or less and having a thickness of 50 nm are alternately deposited by five layers each. The uppermost face of the multilayer part 71 corresponds to the low concentration doped layer. Also in forming the multilayer part 71, the present method for suppressing the formation of macro steps is employed in the same manner as in forming the n-type doped layer 62.

Next, in a procedure shown in FIG. 5C, nitrogen ions are implanted and the activation annealing is performed, so as to form an n-type well 66 including carriers in a concentration of $1 \times 10^{18}$ atoms·cm$^{-3}$ in an upper portion of the p-type well 65 and in a portion of the multilayer part 71 on the p-type well 65. Subsequently, the substrate is thermally oxidized at a temperature of approximately 1100° C., so as to form a gate insulating film 69 on the multilayer part 71. Thereafter, Ni is deposited on the top face of the n-type well 66 and on the reverse face of the SiC bulk substrate 63 by using an electron beam (EB) evaporation system, and the substrate is annealed in a heating furnace at 1000° C. Thus, a source electrode 67 is formed on the n-type well 66 and a drain electrode 68 is formed on the reverse face of the SiC bulk substrate 63. Subsequently, Ti is deposited on the gate insulating film 69 so as to form a gate electrode 70. The gate length is approximately 1 μm. Thus, the vertical MOSFET of this embodiment is fabricated.

The results of examination of the current-voltage characteristic of the vertical MOSFET of this embodiment will now be described.

For comparison, a vertical MOSFET including a substrate fabricated by a conventional method (which is designated as the "conventional vertical MOSFET" in the description of this embodiment) was fabricated, and its current-voltage characteristic was also examined together with that of the vertical MOSFET of this embodiment.

Figure 21C:
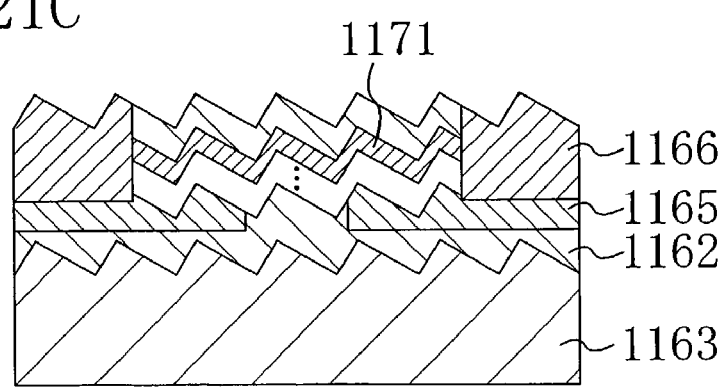

FIG. 21C is a cross-sectional view of a substrate portion of the conventional vertical MOSFET. As shown in FIG. 21C, the conventional vertical MOSFET has the structure the same as that of the vertical MOSFET of this embodiment except that macro steps are formed on the top face and the interfaces between the respective layers in the conventional vertical MOSFET.

In order to compare the performances of these vertical MOSFETs, mutual conductance in the vicinity of the threshold voltage was measured. As a result, it was found that the vertical MOSFET of this embodiment has mutual conductance nearly twice as high as that of the conventional vertical MOSFET.

This seems to be because, in the vertical MOSFET of this embodiment, the top faces and the interfaces between the respective layers made from the epitaxially grown SiC are all flattened, and hence, the mobility of carriers flowing through the channel layer is improved. Also, since the gate insulating film 69 with an even thickness is formed on the flat top face of the multilayer part 71, the mobility of carriers moving on the interface between the gate insulating film 69 and the multilayer part 71 is also improved. This also seems to improve the mutual conductance.

Furthermore, the fabrication conditions were varied so as to fabricate vertical MOSFETs including SiC layers in which the step heights on the top face and the interfaces were respectively different, and the mutual conductance of the respective vertical MOSFETs were measured. As a result, it was confirmed that when the average step height on the top face of the multilayer part 71 and the interfaces in the multilayer part 71 is 30 nm or less, the mutual conductance is sufficiently higher than that of the conventional vertical MOSFET.

As a result, it was found that a high gain and a high operation speed can be attained by the vertical MOSFET of this embodiment including the SiC layers with flat top face and flat interfaces.

Although a vertical MOSFET is fabricated in this embodiment, the flatness on the interfaces and the top face of SiC layers can exhibit the effect to improve the performance in any vertical SiC semiconductor device.

Although the SiC substrate is used in the vertical MOSFET of this embodiment, the bulk substrate, the n-type doped layer and the multilayer part may be made from another semiconductor such as GaN, GaAs, InP, SiGe or SiGeC.

Embodiment 5

As Embodiment 5 of the invention, a processing method for flattening the top face of a SiC substrate or the top face of a grown SiC film, and a SiC substrate fabricated by using the processing method will be described.

First, an annealer used in the processing method for a SiC substrate of this embodiment will be described. In the processing method for a SiC substrate of this embodiment, annealing is performed in this annealer after epitaxially growing a SiC thin film on a SiC substrate.

Figure 7:
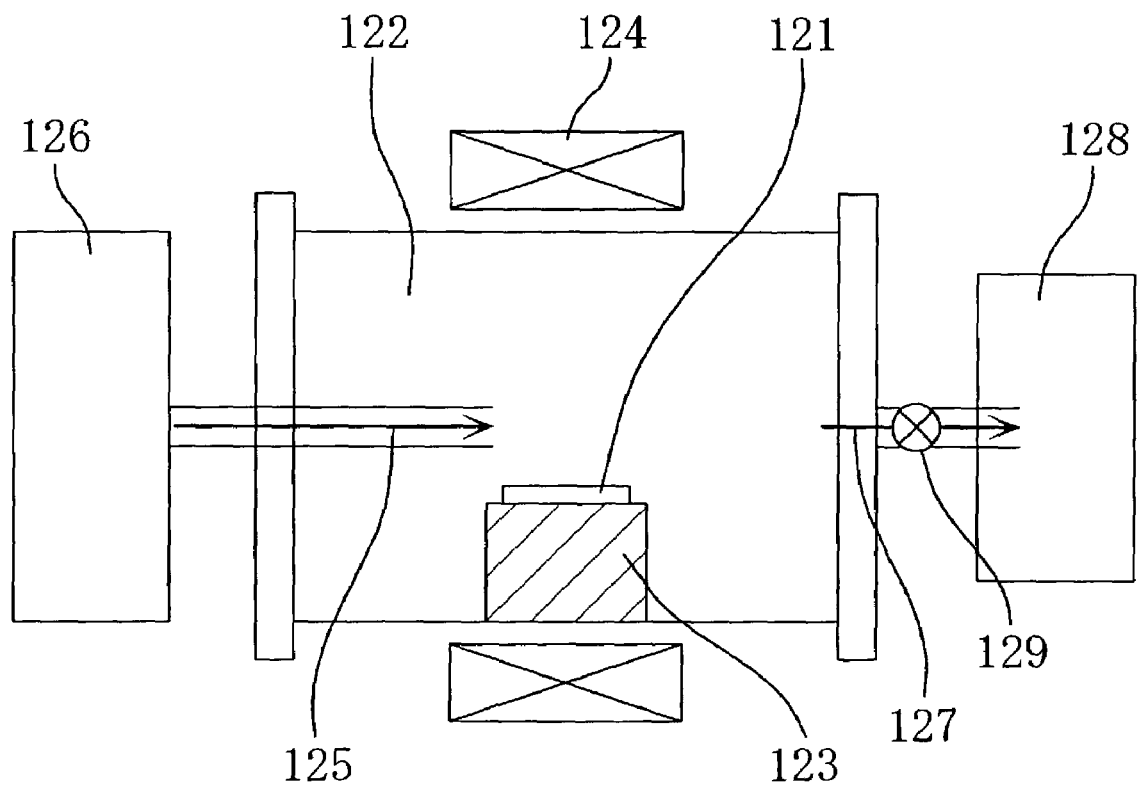
FIG. 7 is a schematic cross-sectional view of an annealer used in the invention.

FIG. 7 is a schematic diagram of the annealer used in this embodiment and other embodiments described below.

As shown in FIG. 7, the annealer used in this embodiment includes a heating furnace 122 of quartz, a susceptor 123 of carbon, a coil 124 coiled around the heating furnace 122, a gas supply system 126 for supplying a hydrogen gas 125 and a diluent gas to the heating furnace 122, a gas exhaust system 128, and a valve 129 provided on an exhaust pipe 127 connecting the heating furnace 122 to the gas exhaust system 128 for adjusting the pressure within the heating furnace 122. A substrate 121 is annealed through high frequency induction by using the coil 124. Also, cooling water can be allowed to flow around the heating furnace 122.

Now, the processing method for a SiC substrate devised by the present inventors and the effect attained by the processing method will be described.

Figure 6A:
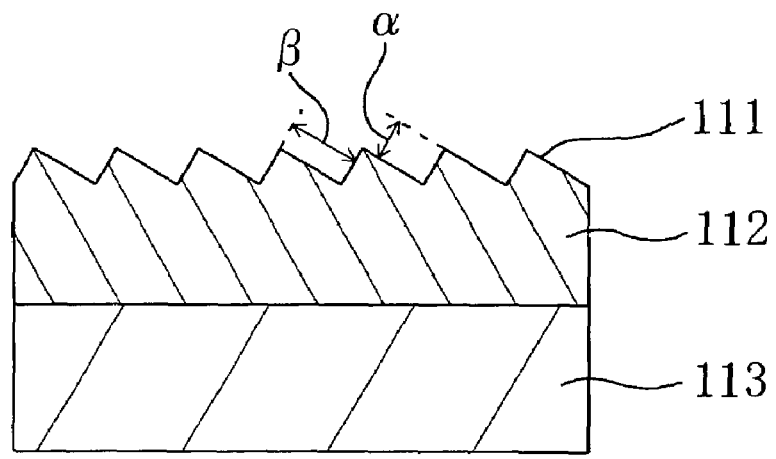
FIGS. 6A, 6B and 6C are cross-sectional views for showing a method for processing a SiC substrate according to Embodiment 5 of the invention.
Figure 6B:
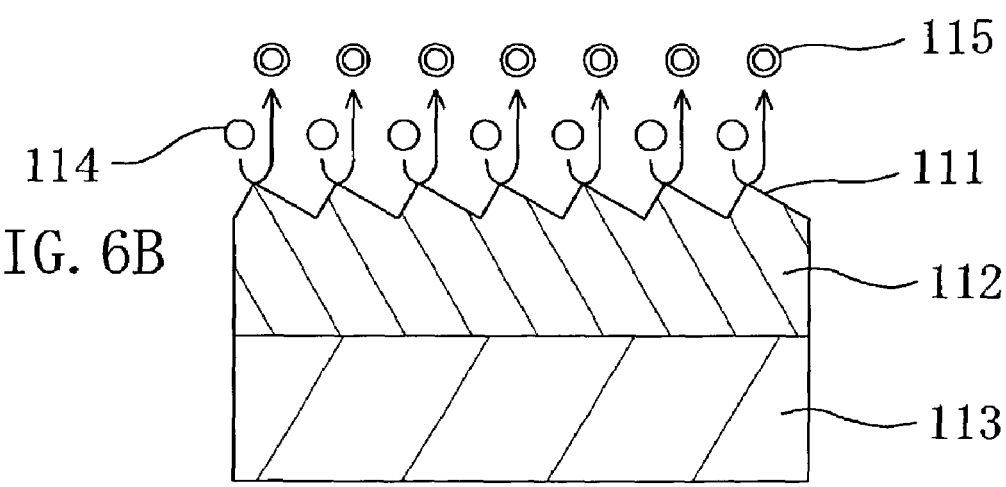
Figure 6C:
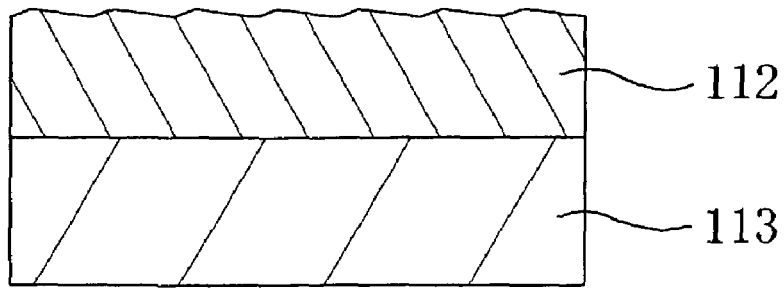

FIGS. 6A through 6C are cross-sectional views for showing the processing method for a SiC substrate of this embodiment.

First, in a procedure shown in FIG. 6A, a 4H—SiC substrate having, as a principal plane, a plane inclined at an off angle of 8 degrees from the (0001) plane (namely, c-plane) in the [11-20] (namely, 112bar0) direction is prepared as a SiC bulk substrate 113. The SiC substrate has a diameter of 50 mm and n-type conductivity.

Next, the SiC bulk substrate is placed in the susceptor 302 of the vertical thin film growth system of FIG. 17, and the pressure within the reactor 300 is reduced to the level of $10^{-6}$ Pa. Then, a hydrogen gas serving as the diluent gas 306 is supplied at a flow rate of 2 L/min. from the gas supply system 308, so as to increase the pressure within the reactor 300 to 90 kPa. The pressure within the reactor 300 is controlled by adjusting the pressure adjust valve 311.

Thereafter, with the flow rate kept, high frequency power of approximately 20.0 kHz at 10 kW is applied to the coil 304 with an induction heating apparatus, so as to heat the susceptor 302. Then, the substrate temperature is controlled to be constant at 1600° C. With the flow rate of the hydrogen gas kept constant, a propane gas and a silane gas serving as the material gas 305 are supplied through a gas inlet of the reactor 300. Each material gas 305 is diluted with a hydrogen gas at a flow rate of 50 mL/min. to be supplied.

The propane gas and the silane gas are supplied onto the SiC substrate placed in the susceptor 302 inductively heated under these conditions, so as to form a SiC thin film 112 on the substrate. The growth time is 1 hour, so that the SiC thin film 112 with a thickness of approximately 3 $\mu$m can be formed on the SiC bulk substrate 113.

On the top face of the SiC thin film 112 formed in this procedure, macro steps 111 with a step height $\alpha$ and a terrace width $\beta$ are formed.

Next, in a procedure shown in FIG. 6B, the substrate is taken out from the vertical thin film growth system, and is placed on the susceptor 123 of the annealer of FIG. 7.

Subsequently, the heating furnace 122 is vacuum evacuated until the pressure within the heating furnace 122 is at the level of $10^{-6}$ Pa, and thereafter, the hydrogen gas 125 is supplied at a flow rate of 2 L/min. from the gas supply system 126 so as to increase the pressure within the heating furnace 122 to 5 kPa. The pressure within the heating furnace 122 is controlled by adjusting the valve 129, and the susceptor 123 is heated by using an induction heating apparatus. The SiC substrate is annealed for 10 minutes with the substrate temperature controlled to be constant at 1450° C. This procedure is designated as hydrogen annealing.

Figure 10:
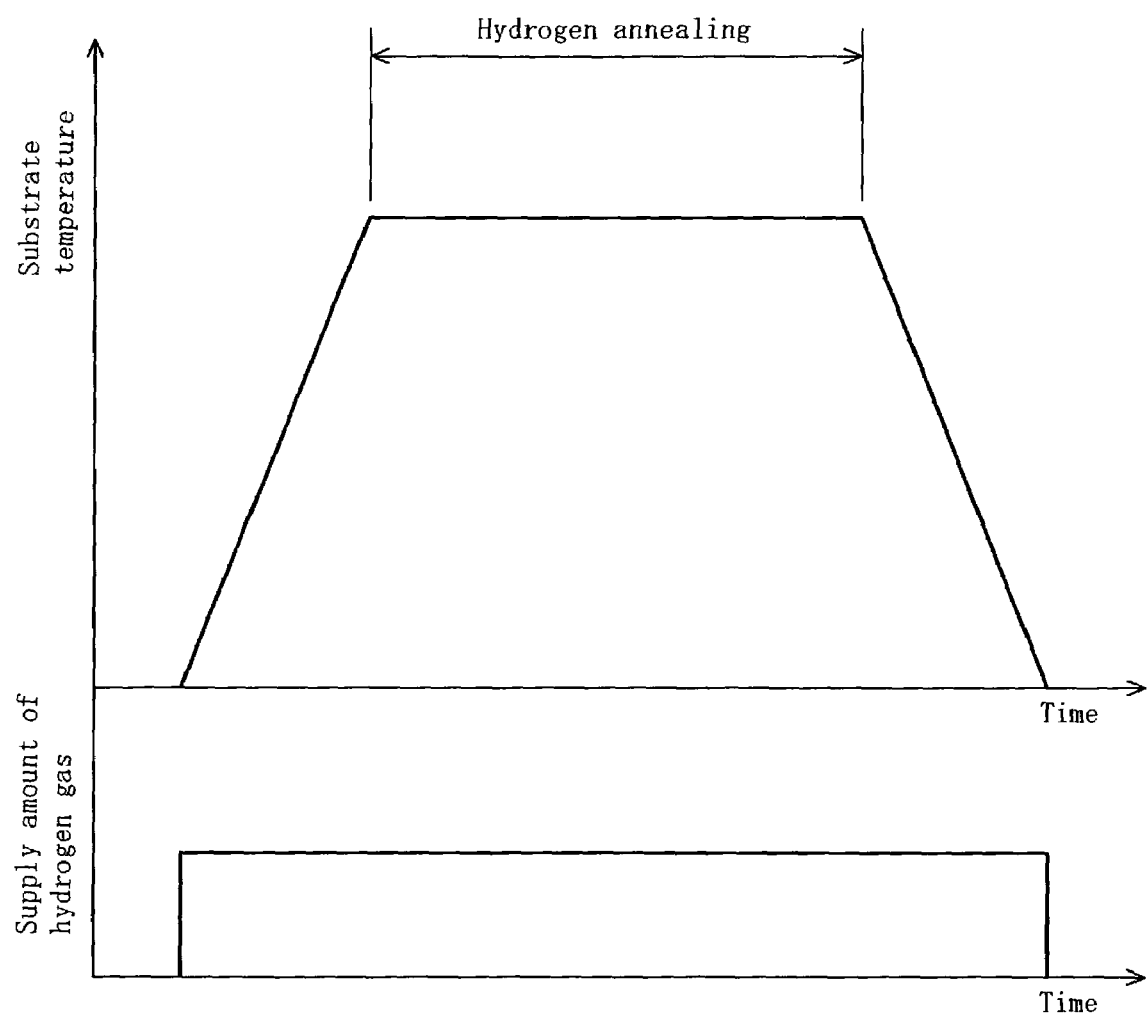
FIG. 10 is a diagram for showing change with time of a substrate temperature and a supply amount of hydrogen gas during the hydrogen annealing.

FIG. 10 is a diagram for showing change with time of the substrate temperature and the supply amount of hydrogen gas in this procedure. It is noted that a diluent gas may be supplied from the gas supply system 126 without changing the pressure within the heating furnace 122.

Next, in a procedure shown in FIG. 6C, the supply of the hydrogen gas 125 is stopped, and the substrate is taken out from the annealer. At this point, the macro steps 111 having been formed on the top face of the SiC thin film 112 are substantially eliminated as described in detail later.

In this manner, the SiC substrate of this embodiment is fabricated.

Next, the results of observation performed for confirming the effect of the processing method of this embodiment will be described.

Figure 8:
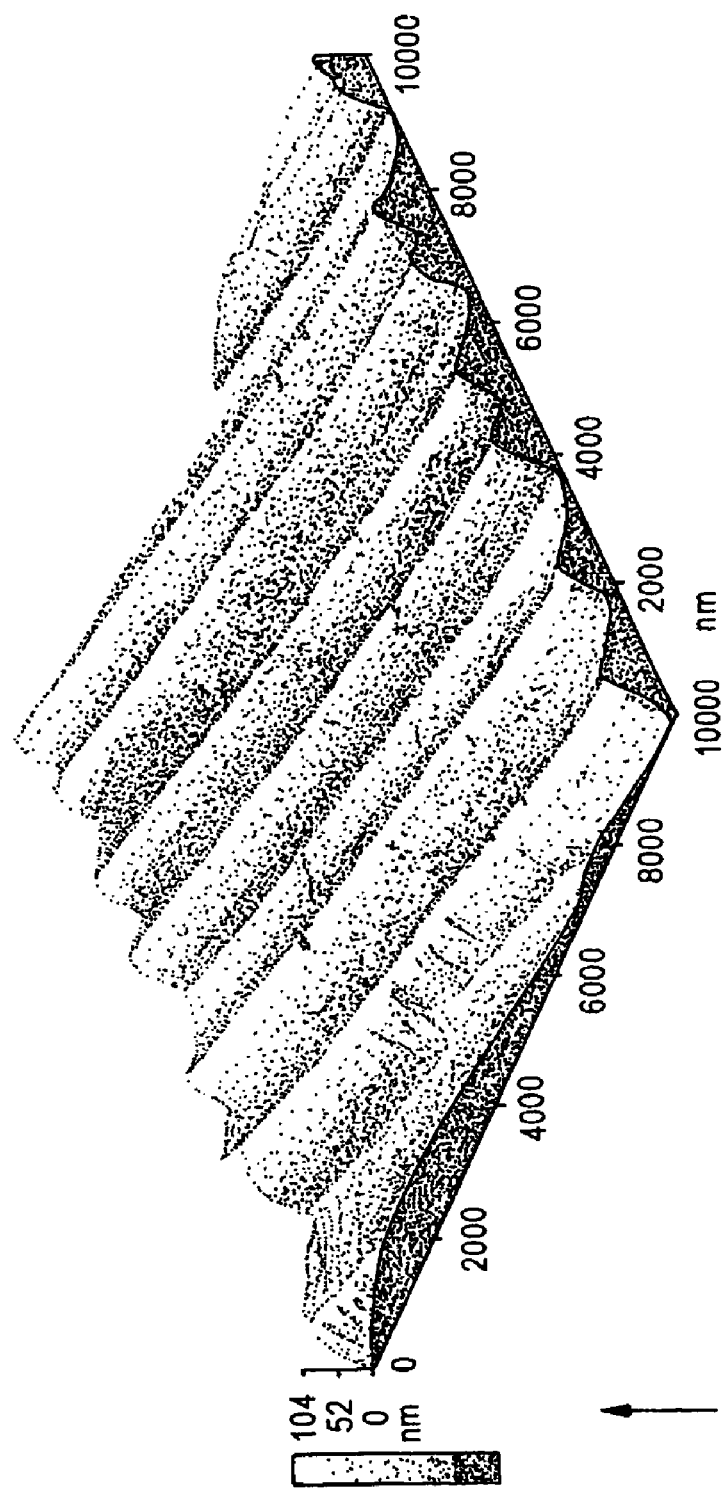
FIG. 8 is a diagram for showing a top face shape of a SiC thin film observed with an AFM before hydrogen annealing.
Figure 9:
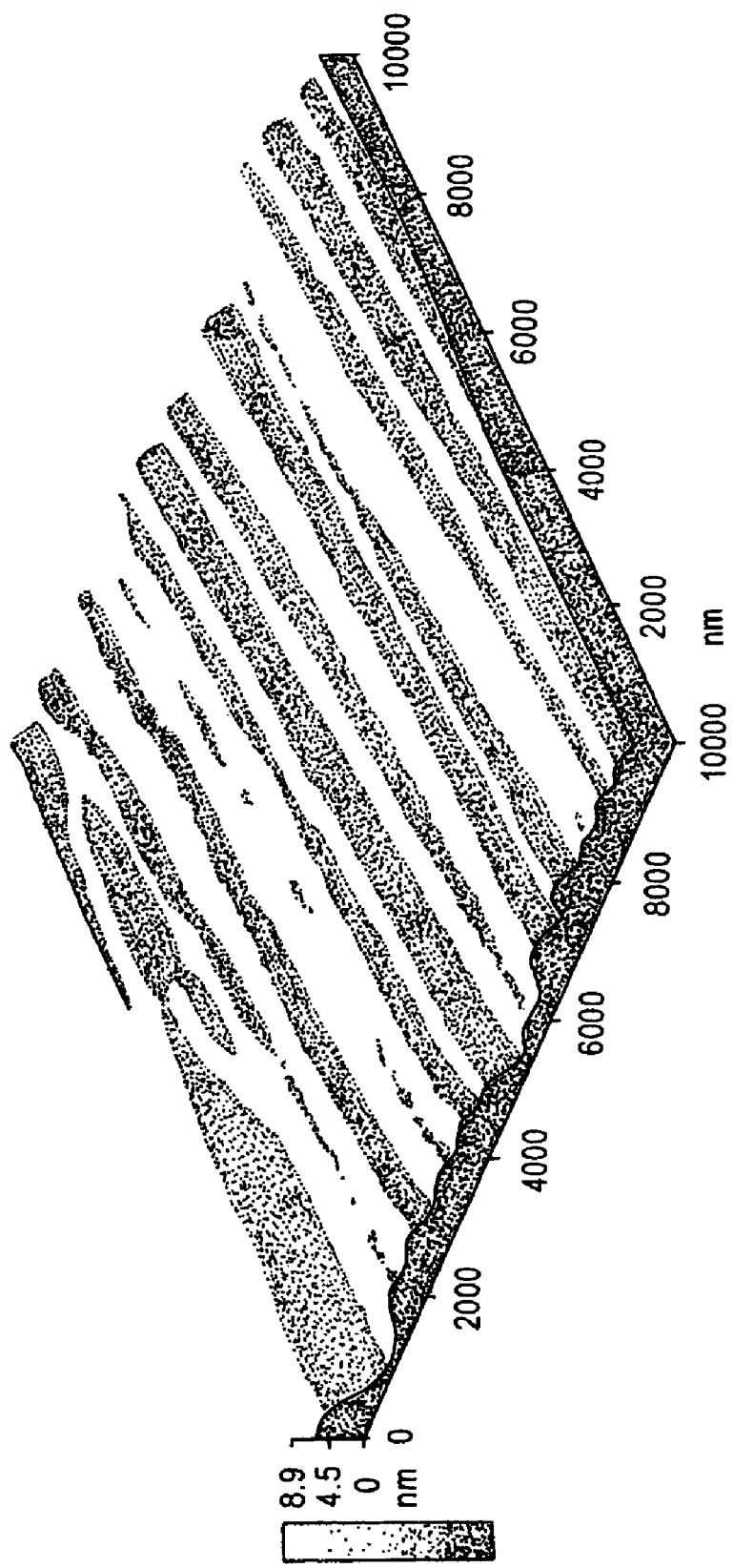
FIG. 9 is a diagram for showing a top face shape of a SiC thin film observed with an AFM after the hydrogen annealing.

FIG. 8 is a diagram for showing the shape of the top face of the SiC thin film 112 obtained before the hydrogen annealing, and FIG. 9 is a diagram for showing the shape of the top face of the SiC thin film 112 obtained after the hydrogen annealing. These drawings show images obtained by using an interatomic force microscope (AFM).

Herein, a state attained before the hydrogen annealing corresponds to the state shown in FIG. 6A, and a state attained after the hydrogen annealing corresponds to the state shown in FIG. 6C.

As is understood from FIG. 8, the sawtooth-shaped macro steps 111 were observed on the top face of the SiC thin film 112 before the hydrogen annealing. When the dimension of the macro steps 111 was evaluated by using an AFM, it was found that the step height is 10 nm through 50 nm and the terrace width is 700 nm through 2000 nm.

In contrast, on the top face of the SiC thin film 112 having been subjected to the hydrogen annealing shown in FIG. 9, the irregularities are much smaller as compared with those obtained before the hydrogen annealing, and it is thus understood that the macro steps 111 are substantially eliminated. When the top face of the SiC thin film 112 was observed with an AFM, it was found that the average step height is approximately 3 nm. Although the sizes of the respective steps are slightly varied, the step heights are all 10 nm or less.

In addition to the observation with an AFM, it was also confirmed (but not shown) through observation with a laser microscope that the macro steps 111 are flattened on the top face of the SiC thin film 112 having been subjected to the hydrogen annealing.

It was confirmed, on the basis of these observation results, that the macro steps 111 on the top face of the SiC thin film 112 formed on the substrate can be flattened by annealing the substrate in a hydrogen atmosphere.

Although not shown in drawings, since the top face of the SiC thin film 112 is etched through the hydrogen annealing, the thickness of the SiC thin film 112 obtained after the hydrogen annealing is reduced by approximately 200 nm as compared with that obtained before the hydrogen annealing.

Also, it was confirmed, on the basis of the observation results, that the SiC substrate fabricated by the method of this embodiment includes, as shown in FIG. 6C, the SiC bulk substrate 113 and the SIC thin film 112 with a thickness of approximately 3 $\mu$m epitaxially grown on the SiC bulk substrate 113, and that the SiC thin film 112 has steps in a wave shape on its face (top face) with an average step height of 3 nm. Furthermore, as described so far, as a characteristic of the SiC substrate of this embodiment, the macro steps formed on a conventional SiC substrate are flattened.

Next, the results of examination on a pressure condition suitable to the hydrogen annealing will be described.

First, with the pressure within the heating furnace increased to 90 kPa, a SiC substrate having macro steps was annealed in a hydrogen atmosphere. In this case, the flow rate of the hydrogen gas was set to 2 L/min. and the temperature of the SiC substrate was set to 1450° C., and the other conditions were the same as those employed in the procedure shown in FIG. 6B.

Next, the top face of the SiC substrate obtained after the hydrogen annealing under the aforementioned conditions was observed with an AFM and a laser microscope. As a result, it was found that the macro steps still remain on the top face of the SiC thin film in the shape substantially the same as that obtained before the hydrogen annealing.

Therefore, the hydrogen annealing was performed under various conditions, and it was found that the shape of a SiC top face obtained after the hydrogen annealing largely depends upon the pressure. Specifically, it was found, as a result of the examination, that the macro steps are flattened when the pressure employed in the hydrogen annealing is 10 kPa or less and cannot be flattened when the pressure is higher than 10 kPa.

On the basis of this result, the macro steps are flattened probably for the following reason:

First, it seems that hydrogen collides with the SiC substrate top face so as to scrape the substrate top face by keeping a high temperature in a hydrogen atmosphere.

In particular under pressure of 10 kPa or less, the hydrogen 114 collides with the tip of the macro step 111 as shown in FIG. 6B, and the etching is proceeded because a reaction product seed 115 resulting from the collision sublimates. It seems that this results in reducing the step height of the macro step 111 so as to flatten the top face.

On the other hand, under pressure exceeding 10 kPa, the reaction caused by the hydrogen occurs not on the tip of the macro step but on the terrace, and hence, the step height is not largely changed. It seems that this results in allowing the sawtooth-shaped macro steps 111 to remain.

It is confirmed, on the basis of these results, that macro steps formed on the top face of a SiC thin film can be flattened by annealing the SiC substrate in a hydrogen atmosphere under pressure of 10 kPa or less.

In this manner, in the SiC substrate fabricated by the method of this embodiment, the irregularities caused on the top face are remarkably smaller than those on a conventional substrate, and therefore, a variety of semiconductor devices, such as a Schottky diode having a high breakdown voltage, a field effect transistor and a pn diode having large driving power, can be fabricated by using the SiC substrate. The application to these semiconductor devices will be described in detail in embodiments described below.

The hydrogen annealing is performed with the flow rate of the hydrogen set to 2 L/min. in the processing method for a SiC substrate of this embodiment, which does not limit the invention. However, the flow rate of the hydrogen is preferably within a range from 1 mL/min. to 10 L/min. for practical use.

Also, although the substrate temperature is set to 1450° C. in the hydrogen annealing of this embodiment, it is found through examination of conditions that a SiC substrate top face can be flattened if the substrate temperature is 700° C. through 1700° C.

When a SiC bulk substrate whose top face has been thus flattened is applied to a device, high device performance such as a higher breakdown voltage and larger current driving power can be realized.

Furthermore, although the top face of the SiC thin film epitaxially grown is flattened in the processing method of this embodiment, the top face of a SiC bulk substrate on which macro steps have been formed can be flattened by the processing method. When a SiC bulk substrate having been processed by the method of this embodiment is applied to, for example, the growth method for a SiC film described in Embodiment 1, a SiC substrate having the δ-doped multi-layered structure and having a more flattened top face can be obtained. By using this SiC substrate, a semiconductor device having a higher operation speed and a higher breakdown voltage can be fabricated.

Moreover, the SiC substrate having an average step height of irregularities formed on the top face of approximately 3 nm is fabricated in the processing method of this embodiment. Instead, a SiC substrate having an average step height on its top face of approximately 5 nm, which is fabricated by, for example, reducing the time for performing the hydrogen annealing, can be used to realize a device with a higher breakdown voltage and larger current driving power than those attained by the conventional technique.

Also, although the 4H—SiC substrate is used as the SiC bulk substrate in this embodiment, a 6H—SiC or another polytype SiC substrate may be used instead. In particular, a substrate having, as the top face, a plane such as the β-SiC (111) plane, the α-SiC (0001) plane of 6H—SiC or 4H—SiC, or the Si plane of 15R—SiC, is preferably used because a SiC layer can be more easily epitaxially grown on such a substrate than on a substrate having the C (carbon) plane as the top face.

According to the processing method of this embodiment, the macro steps 111 can be flattened regardless of the conductivity type of the SiC thin film 112.

Figure 11:
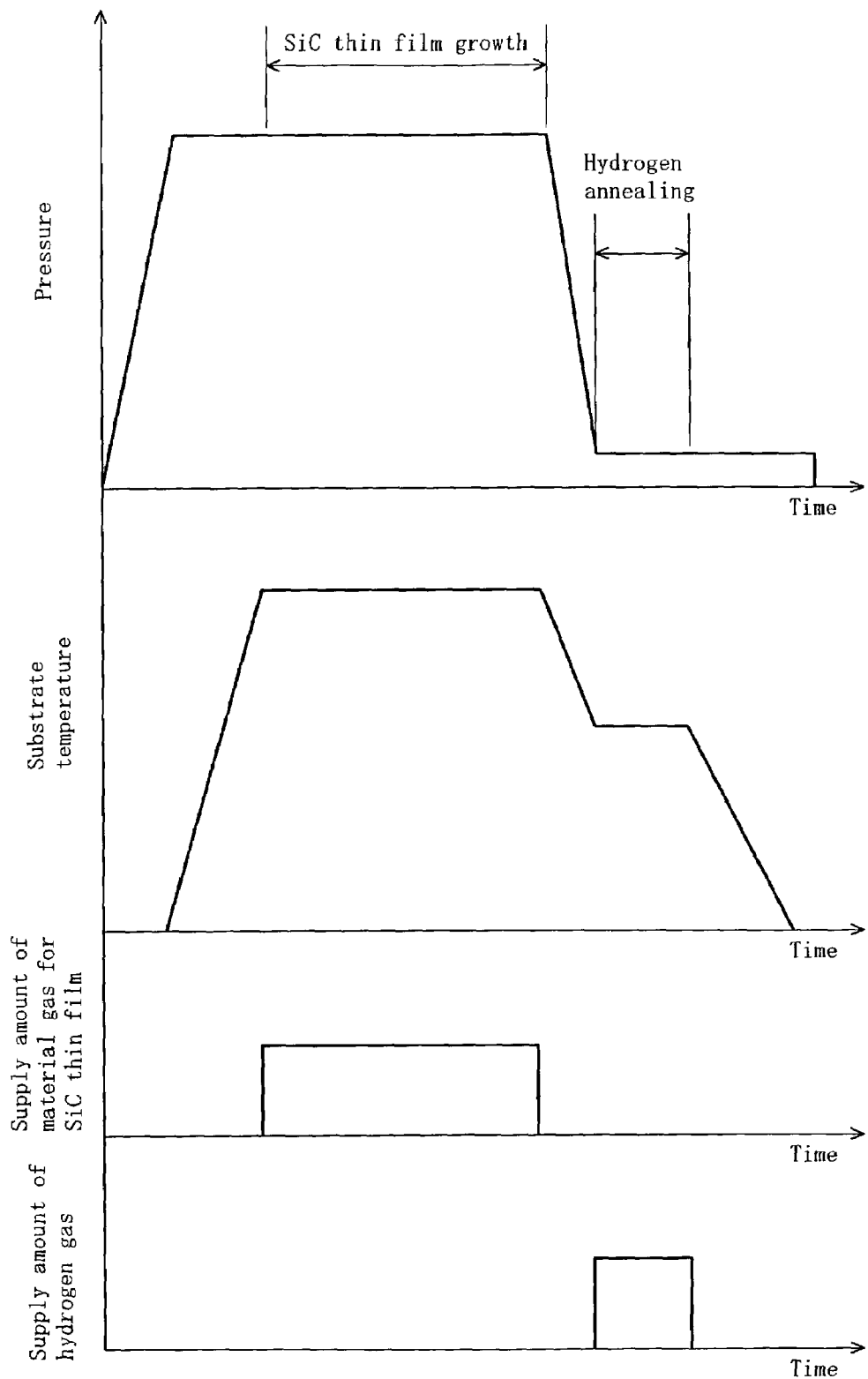
FIG. 11 is a diagram for showing change with time of a pressure, a substrate temperature and supply amounts of gases during growth of a SiC thin film and the hydrogen annealing performed in one vertical thin film growth system.

FIG. 11 is a diagram for showing change with time of various conditions to be employed when the epitaxial growth and the hydrogen annealing are performed in one CVD system. Although the epitaxial growth of a SiC thin film and the hydrogen annealing are performed in different systems in this embodiment, the hydrogen annealing may be performed in the CVD system (vertical thin film growth system), as shown in FIG. 11, by stopping the supply of the material gas after growing the SiC thin film and adjusting the pressure. In this case, the substrate can be efficiently processed because there is no need to move the substrate from one system to another.

Although the hydrogen annealing is performed for 10 minutes in this embodiment, the upper limit of the processing time is not particularly specified. The shortest processing time depends upon the flow rate of the hydrogen gas.

In the processing method of this embodiment, the thickness of the SiC thin film 112 is approximately 50 nm or more because the thin film should be etched merely by a thickness corresponding to the height of the macro step 111.

Also, in the hydrogen annealing of this embodiment, the thickness of the upper portion of the substrate is reduced by approximately 200 nm as compared with that obtained before the hydrogen annealing due to the etching with hydrogen. The thickness of the SiC thin film 112 to be etched can be controlled by changing the conditions for the hydrogen annealing. Thus, the thickness of the SiC thin film 112 obtained after flattening the macro steps can be controlled.

The processing method of this embodiment is applicable to other semiconductor substrates of GaN, GaAs and the like other than the SiC substrate. However, in these other semiconductor substrates, the effect to flattening the substrate top face with hydrogen is smaller than in the SiC substrate.

Although the substrate having the macro steps is annealed in a hydrogen atmosphere in the processing method of this embodiment, the same effect can be attained by using hydrogen chloride (HCl) instead of hydrogen. However, hydrogen is more preferred because the top face can be more efficiently flattened.

Embodiment 6

As Embodiment 6 of the invention, a Schottky diode fabricated by using the SiC substrate of Embodiment 5 will be described.

Figure 12A:
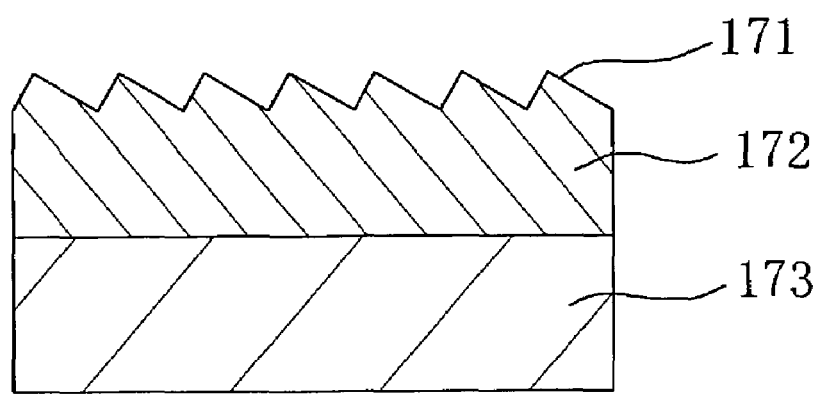
FIGS. 12A, 12B and 12C are cross-sectional views for explaining procedures for fabricating a Schottky diode according to Embodiment 6 of the invention.
Figure 12B:
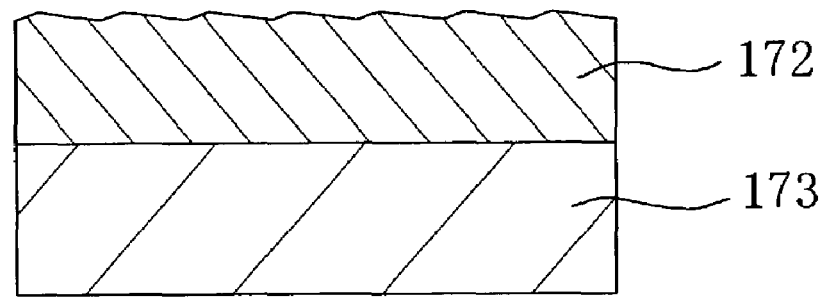
Figure 12C:
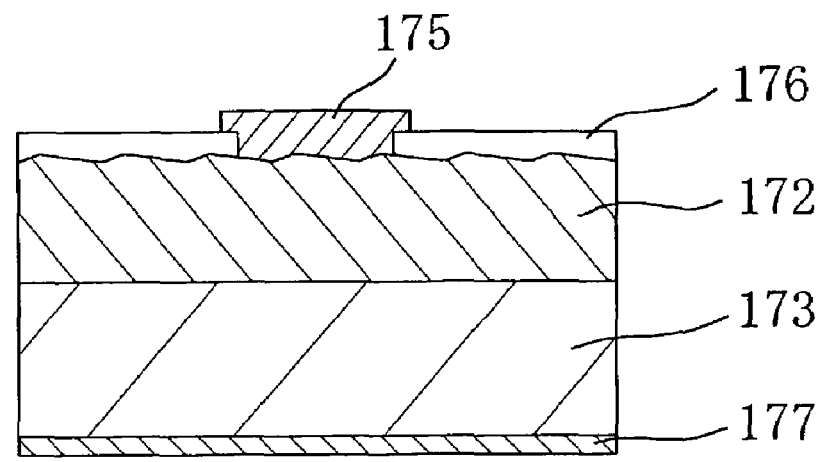

FIGS. 12A through 12C are cross-sectional views for showing a method for fabricating the Schottky diode of this embodiment.

First, in a procedure shown in FIG. 12A, a 4H—SiC substrate having, as a principal plane, a plane inclined at an off angle of 8 degrees from the (0001) plane (i.e., the c-plane) in the [11-20] direction is prepared as a SiC bulk substrate 173. This SiC bulk substrate 173 has n-type conductivity and a carrier concentration of $1 \times 10^{18}$ atoms·cm$^{-3}$.

Next, the SiC bulk substrate 173 is placed in the susceptor 302 within the reactor 300 of the vertical thin film growth system of FIG. 17. Then, in the same manner as in Embodiment 5, a hydrogen gas is supplied at a flow rate of 2 L/min. from the gas supply system 308, and thereafter, the SiC bulk substrate 173 is annealed to 1600° C. through the induction heating by using the coil 304. Then, a propane gas and a silane gas are supplied at flow rates of 2 mL/min. and 3 mL/min., respectively, and a nitrogen gas serving as an n-type dopant gas is supplied, so as to epitaxially grow an n-type doped layer 172 of SiC with a thickness of approximately 10 μm on the principal plane of the SiC bulk substrate 173. The pressure within the chamber and the growth temperature in growing the n-type doped layer 172 are fixed to the normal pressure (1 atm) and 1600° C., respectively. Also, the carrier concentration in the n-type doped layer 172 is $1 \times 10^{16}$ cm$^{-3}$.

Next, the supply of the material gas and the annealing of the substrate are stopped, so as to end the growth of the n-type doped layer 172.

At this point, macro steps 171 with an average step height of approximately 50 nm and an average terrace width of approximately 1000 nm are formed on the top face of the n-type doped layer 172.

Subsequently, in a procedure shown in FIG. 12B, the substrate is taken out from the vertical thin film growth system, and is placed on the susceptor 123 of the heating furnace 122 of the annealer of FIG. 7. Thereafter, the pressure within the heating furnace is reduced to the level of $10^{-6}$ Pa.

Next, a hydrogen gas is supplied at a flow rate of 2 L/min. from the gas supply system 126, so as to increase the pressure within the heating furnace 122 to 5 kPa, and the substrate is annealed until the substrate temperature reaches 1450° C. Then, the substrate temperature is kept at 1450° C. for 10 minutes.

In this procedure, the macro steps 171 having been formed on the top face of the n-type doped layer 172 are flattened. When the shape of the top face of the n-type doped layer 172 under this condition was evaluated with an AFM, it was found that the average step height is approximately 3 nm.

Next, in a procedure shown in FIG. 12C, nickel (Ni) is deposited by using a vacuum evaporation system on a reverse face (a plane opposing the principal plane) of the SiC bulk substrate 173. Then, the substrate is annealed for 3 minutes at 1000° C., so as to form an ohmic electrode 177 on the reverse face of the SiC bulk substrate 173.

Subsequently, after forming a silicon oxide (SiO$_2$) film on the n-type doped layer 172 by the CVD or the like, an opening is formed in a portion of the silicon oxide film so as to form a guard ring 176. Then, gold (Au) is deposited in the opening of the guard ring 176, so as to form a Schottky electrode 175.

The Schottky diode of this embodiment fabricated in the aforementioned manner includes the n-type SiC bulk substrate 173, the n-type doped layer 172 epitaxially grown on the principal plane of the SiC bulk substrate 173 and made from SiC including an n-type dopant, the guard ring 176 of SiO$_2$ provided on the n-type doped layer 172 and having the opening, the Schottky electrode 175 of Au formed on a portion of the n-type doped layer 172 in the opening of the guard ring 176, and the ohmic electrode 177 of Ni provided on the reverse face of the SiC bulk substrate 173.

Next, the Schottky diode of this embodiment was evaluated for its performance through measurement of its current-voltage characteristic, and the result will now be described.

First, a Schottky diode fabricated without performing the hydrogen annealing in the procedure of FIG. 12B (referred to as the "conventional Schottky diode" in this embodiment) was prepared to be compared with the Schottky diode of this embodiment. In the conventional Schottky diode, the thickness of the n-type doped layer was set to 10 µm and the carrier concentration was set to $1 \times 10^{16}$ cm$^{-3}$, so that these two Schottky diodes could be substantially the same in the thickness of the channel layer and the carrier concentration. In both the Schottky diodes, the SiC layers were grown by using the vertical thin film growth system of FIG. 17.

A reverse bias voltage was applied to each of the Schottky diodes, so as to measure a reverse breakdown voltage at which breakdown occurs. As a result, it was found that the breakdown voltage of the Schottky diode of this embodiment fabricated by the present method is higher than that of the conventional Schottky diode.

The reason seems to be as follows:

In the conventional Schottky diode, the thickness of the n-type doped layer is varied due to the macro steps. Therefore, the electric field is collected at the tip of the macro step, and hence, it seems that a leakage current can easily flow when a reverse bias voltage is applied. In contrast, in the Schottky diode of this embodiment, the top face of the n-type doped layer 172 is flattened, and hence, the thickness of this layer is less varied. Therefore, the electric field is uniformly applied. This seems to result in a high breakdown voltage characteristic, that is, a characteristic innate in SiC.

It is confirmed, on the basis of the above-described result, that a Schottky diode having an advantage of a high breakdown voltage can be fabricated by flattening the top face of a deposited SiC layer.

Although the SiC substrate according to Embodiment 5 is applied to a Schottky diode in this embodiment, a pn diode in which an n-type SiC layer and a p-type SiC layer are respectively epitaxially grown on a SiC bulk substrate can be fabricated. In this case, the hydrogen annealing should be performed twice, namely, once after growing an n-type doped layer and once after growing a p-type doped layer. In such a case, the hydrogen annealing is performed in a vertical thin film growth system (CVD system) under conditions as shown in FIG. 11. Thus, a pn diode having a high breakdown voltage can be fabricated.

Although a Schottky diode including a SiC bulk substrate and an n-type doped layer is fabricated in this embodiment, since the top face of a GaN layer or a GaAs layer can be flattened by the hydrogen annealing, a diode using such a compound semiconductor can be fabricated.

Although the 4H—SiC substrate is used as the SiC bulk substrate in the Schottky diode of this embodiment, a SiC substrate of 6H—SiC or another polytype may be used instead.

Embodiment 7

As Embodiment 7 of the invention, a MESFET fabricated by using the SiC substrate of Embodiment 5 will be described.

Figure 13A:
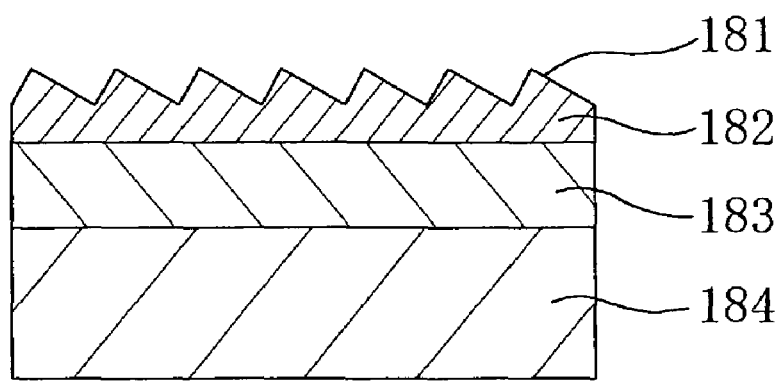
FIGS. 13A, 13B and 13C are cross-sectional views for explaining procedures for fabricating a MESFET according to Embodiment 7 of the invention.
Figure 13B:
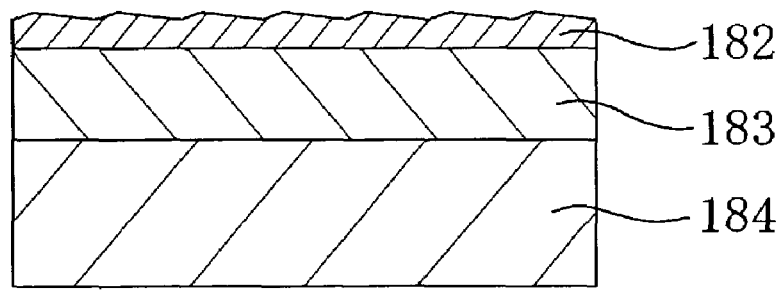
Figure 13C:
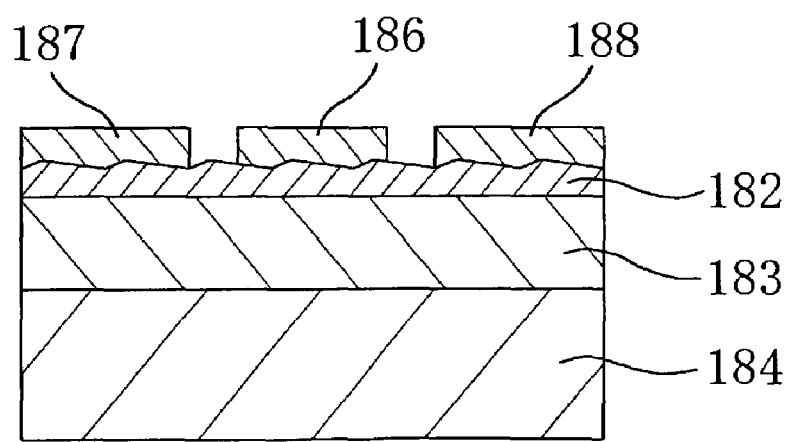

FIGS. 13A through 13C are cross-sectional views for showing procedures for fabricating the MESFET of this embodiment.

First, in the procedure shown in FIG. 13A, a SiC bulk substrate 184 of 4H—SiC is prepared. Next, the SiC bulk substrate 184 is placed in the susceptor 302 within the reactor 300 of the vertical thin film growth system of FIG. 17. Then, a hydrogen gas is supplied at a flow rate of 2 L/min. from the gas supply system 308, and the SiC bulk substrate 184 is then annealed.

Next, with the substrate annealed, a propane gas and a silane gas are supplied at flow rates of 2 mL/min. and 3 mL/min., respectively, so as to epitaxially grow an undoped layer 183 of SiC with a thickness of approximately 3 µm on the SiC bulk substrate 184. The pressure within the chamber and the growth temperature in growing the undoped layer 183 are fixed to the normal pressure (1 atm) and 1600° C., respectively.

Then, with the supply of the propane gas and the silane gas stopped and the hydrogen gas alone supplied, the temperature is lowered for performing the hydrogen annealing, so as to flatten the top face of the undoped layer 183.

Thereafter, a propane gas and a silane gas are supplied at flow rates of 2 mL/min. and 3 mL/min., respectively and the substrate temperature is increased again to 1600° C., and a nitrogen gas is supplied as a dopant. Thus, an n-type doped layer 182 of SiC having a thickness of 400 nm and a carrier concentration of approximately $2 \times 10^{17}$ cm$^{-3}$ is epitaxially grown on the flattened undoped layer 183. It was confirmed through observation with an AFM that macro steps 181 with an average step height of 50 nm and an average terrace width of 1000 nm are formed on the top face of the n-type doped layer 182.

Next, in the procedure shown in FIG. 13B, the substrate is taken out from the vertical thin film growth system, and is placed on the susceptor 123 within the heating furnace 122 of the annealer of FIG. 7. Thereafter, the pressure within the heating furnace is reduced to the level of $10^{-6}$ Pa.

Then, a hydrogen gas is supplied at a flow rate of 2 L/min. from the gas supply system 126, so as to increase the pressure within the heating furnace to 5 kPa, and the substrate is then annealed at 1450° C. The annealing time is 10 minutes.

Through this procedure, the top face of the n-type doped layer 182 is flattened, and the macro steps 181 are substantially eliminated. At this point, it was found through evaluation of the shape of the substrate top face with an AFM that the average step height is 3 nm. Since a surface portion of the n-type doped layer 182 is etched, the thickness of the n-type doped layer 182 becomes 200 nm.

Next, in the procedure shown in FIG. 13C, a SiO$_2$ layer is formed on the n-type doped layer 182, and an opening is formed in a portion of the SiO$_2$ layer. Subsequently, with the SiO$_2$ layer used as a mask, nickel (Ni) is deposited on the n-type doped layer 182. Thereafter, the SiO$_2$ layer serving as the mask is removed. Then, the substrate is subjected to annealing for 3 minutes at 1000° C., so as to form a source electrode 187 and a drain electrode 188 that are ohmic electrodes.

Then, gold (Au) is deposited on a portion of the n-type doped layer 182 between the source electrode 187 and the drain electrode 188 by using a similar mask, so as to form a gate electrode 186 serving as a Schottky electrode. Thus, the MESFET of this embodiment is fabricated.

In the MESFET of this embodiment, the thickness of a channel layer is 200 nm, the carrier concentration is $2 \times 10^{17}$ cm$^{-3}$ and the gate length is approximately 0.5 µm.

In this manner, the MESFET of this embodiment includes the n-type SiC bulk substrate 184, the undoped layer 183 made from undoped SiC epitaxially grown on the SiC bulk substrate 184, the n-type doped layer 182 made from n-type SiC with a thickness of approximately 200 nm provided on the undoped layer 183, the gate electrode 186 of Au provided on the n-type doped layer 182, and the source electrode 187 and the drain electrode 188 of Ni provided on the n-type doped layer 182 on both sides of the gate electrode 186. Also, irregularities with an average step height of approximately 3 nm are formed on the top face of the n-type doped layer 182. The source electrode 187 and the drain electrode 188 are respectively spaced from the gate electrode 186.

Next, the MESFET of this embodiment is evaluated for its performance by measuring the relationship between a drain current and a gate voltage. The results are as follows:

First, a MESFET fabricated without performing the hydrogen annealing in the procedure of FIG. 13B was prepared for comparison. In this MESFET, the thickness of the channel layer was 200 nm, the carrier concentration was $2 \times 10^{17}$ cm$^{-3}$ and the gate length was approximately 0.5 µm, so that these MESFETs could be the same in the carrier concentration and the thickness of the channel layer. In this embodiment, this MESFET is referred to as the "conventional MESFET".

Next, the current-voltage characteristics of the MESFET of this embodiment and the conventional MESFET were examined. Specifically, the mutual conductance in the vicinity of the threshold voltage of each MESFET was measured to be compared.

As a result, it was found that the mutual conductance of the MESFET of this embodiment is nearly twice as high as that of the conventional MESFET. The reason seems to be as follows:

In the conventional MESFET, since the macro steps are formed on the top face of the n-type doped layer serving as the channel, the movement of carriers is prevented, which seems to lower the carrier mobility. In contrast, in the MESFET of this embodiment, since the top face of the n-type doped layer 182 is flattened, the movement of carriers is not prevented, which seems to result in improving the carrier mobility. This applies not only to the MESFET but also to a MISFET or a bipolar transistor in which a current flows in the lateral direction (i.e., a direction parallel to the substrate face).

In this manner, it was confirmed that a MESFET with large carrier mobility and a high operation speed can be fabricated by flattening the top face of a SiC layer serving as the channel. The MESFET of this embodiment can exhibit a high breakdown voltage property innate in SiC, and therefore, a large driving current can be attained as compared with a MESFET using GaAs (gallium arsenic) as a substrate.

Although the SiC substrate of Embodiment 5 is applied to a MESFET in this embodiment, the SiC substrate can be applied to a SiC semiconductor device having a lateral structure, such as a MISFET or a bipolar transistor, as described above. For example, when the SiC substrate is applied to an n-type MISFET, the hydrogen annealing is performed after epitaxially growing p-type SiC on a SiC bulk substrate, a gate insulating film and a gate electrode are provided on the SiC layer whose top face has been flattened, and dopant diffusion layers are provided by ion implanting an n-type dopant into portions on both sides of the gate electrode.

Although the n-type doped layer 182 has a thickness of approximately 200 nm and the undoped layer 183 has a thickness of approximately 3 µm in the MESFET of this embodiment, the thicknesses of these layers are not limited to them.

Similarly to the Schottky diode of Embodiment 6, a substrate of a polytype other than 4H—SiC may be used in the MESFET of this embodiment.

Embodiment 8

As Embodiment 8 of the invention, a vertical MOSFET fabricated by using the SiC substrate of Embodiment 5 will be described.

Figure 14A:
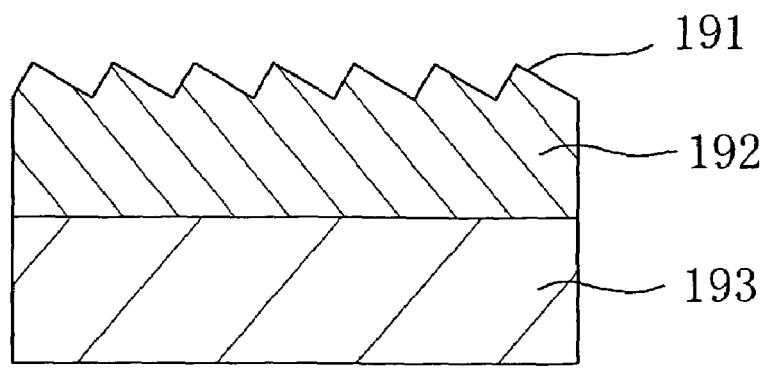
FIGS. 14A, 14B and 14C are cross-sectional views for explaining procedures for fabricating a vertical MOSFET according to Embodiment 8 of the invention.
Figure 14B:
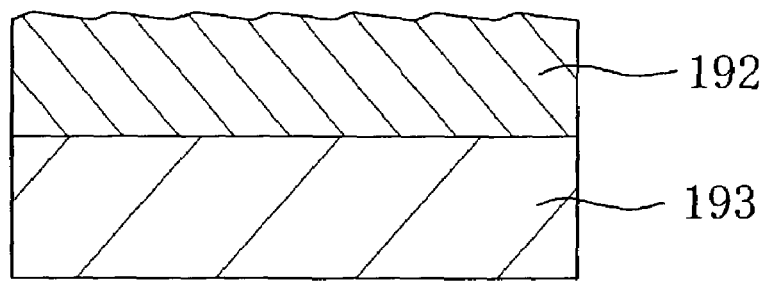
Figure 14C:
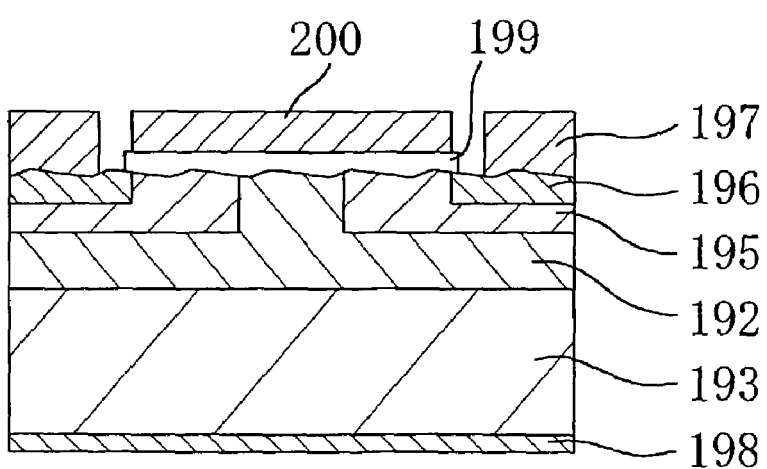

FIGS. 14A through 14C are cross-sectional views for showing procedures for fabricating the vertical MOSFET of this embodiment.

First, in the procedure shown in FIG. 14A, a SiC bulk substrate 193 of 4H—SiC is prepared. This substrate has n-type conductivity and a carrier concentration of $1 \times 10^{18}$ cm$^{-3}$. Next, the SiC bulk substrate 193 is placed in the susceptor 302 within the reactor 300 of the vertical thin film growth system of FIG. 17. Then, a hydrogen gas is supplied at a flow rate of 2 L/min. from the gas supply system 308, and the SiC bulk substrate 193 is annealed.

Next, with the substrate annealed, a propane gas and a silane gas are supplied at flow rates of 2 mL/min. and 3 mL/min., respectively, and a nitrogen gas serving as an n-type dopant gas is supplied, so as to epitaxially grow an n-type doped layer 192 of n-type SiC with a thickness of 10 μm on the principal plane of the SiC bulk substrate 193. In growing the n-type doped layer 192, the pressure within the chamber is set to be constant at the normal pressure and the growth temperature is set to 1600° C. The carrier concentration in the n-type doped layer 192 is set to $2\times10^{17}$ cm$^{-3}$. It was confirmed through observation with an AFM that macro steps 191 with an average step height of 50 nm and an average terrace width of 1000 nm are formed on the top face of the n-type doped layer 192.

Next, in the procedure shown in FIG. 14B, the substrate is taken out from the vertical thin film growth system, and is placed on the susceptor 123 within the heating furnace 122 of the annealer of FIG. 7. Then, the pressure within the heating furnace is reduced to the level of $10^{-6}$ Pa.

Then, a hydrogen gas is supplied at a flow rate of 2 L/min. from the gas supply system 126, so as to increase the pressure within the heating furnace 122 to 5 kPa, and thereafter, the substrate is annealed at 1450° C. The annealing time is 10 minutes. Through this procedure, the macro steps 191 having been formed on the top face of the n-type doped layer 192 are flattened. When the shape of the top face of the n-type doped layer 192 was evaluated with an AFM, it was found that the average step height is 3 nm.

Next, in the procedure shown in FIG. 14C, aluminum (Al) ions are implanted into the n-type doped layer 192 for forming a channel layer of the MOSFET, and the activation annealing is performed. Thus, a portion of the n-type doped layer 192 is formed into a p-type well 195 with a carrier concentration of $1\times10^{16}$ cm$^{-3}$.

Then, nitrogen ions are implanted into the p-type well 195 for forming a contact layer of the source of the MOSFET, and the activation annealing is performed. Thus, a portion of the p-type well 195 is formed into an n-type well 196 with a carrier concentration of $1\times10^{18}$ cm$^{-3}$.

Subsequently, the substrate is thermally oxidized at approximately 1100° C., so as to form a gate insulating film 199 of SiO$_2$ with a thickness of 30 nm on the substrate. Then, a portion of the SiO$_2$ film present above the n-type well 196 is removed by using buffered fluoric acid. Thereafter, Ni is deposited on the top face of the n-type well 196 and on the reverse face of the SiC bulk substrate 193 by using an electron beam (EB) evaporation system. Then, the substrate is annealed in the heating furnace at 1000° C., so as to form a source electrode 197, that is, an ohmic electrode, on the n-type well 196 and a drain electrode 198, that is, an ohmic electrode, on the reverse face of the SiC bulk substrate 193.

Subsequently, titanium (Ti) is deposited on the gate insulating film, so as to form a gate electrode 200. The gate electrode 200 has a gate length of approximately 1 μm.

The vertical MOSFET of this embodiment fabricated in the aforementioned manner includes the n-type SiC bulk substrate 193, the n-type doped layer 192 with a thickness of 10 μm epitaxially grown on the principal plane of the SiC bulk substrate 193 and including nitrogen, the p-type well 195 provided to be surrounded with the n-type doped layer 192 and including Al, the n-type well 196 provided to be surrounded with the p-type well 195 and including nitrogen, the gate insulating film 199 of SiO$_2$ provided over the two p-type wells 195 and the n-type doped layer 192 sandwiched therebetween, the gate electrode 200 of Ti provided on the gate insulating film 199, the source electrode 197 of Ni provided on the n-type well 196, and the drain electrode 198 of Ni provided on the reverse face of the SiC bulk substrate 193. Also, the top faces of the n-type doped layer 192, the p-type well 195 and the n-type well 196 are flattened.

Next, the vertical MOSFET of this embodiment was evaluated for its performance by measuring the relationship between a drain current and a gate voltage. The results are as follows:

First, a vertical MOSFET fabricated without performing the hydrogen annealing in the procedure of FIG. 14B was prepared for comparison. The procedures for fabricating this vertical MOSFET were the same as those for the vertical MOSFET of this embodiment except for the hydrogen annealing, and this comparative vertical MOSFET had the same structure as that of the vertical MOSFET of this embodiment with the same gate length of approximately 1 μm. This comparative vertical MOSFET is referred to as the "conventional vertical MOSFET" in this embodiment.

Next, the current-voltage characteristics of the vertical MOSFET of this embodiment and the conventional vertical MOSFET were examined. Specifically, the mutual conductance in the vicinity of the threshold voltage of each vertical MOSFET was measured for comparison.

As a result, it was found that the mutual conductance of the vertical MOSFET of this embodiment is nearly twice as high as that of the conventional vertical MOSFET. This seems to be for the following reason:

First, in the conventional vertical MOSFET, there are macro steps on the top faces of the n-type doped layer, the p-type well and the n-type well. The average step height of the macro steps is 50 nm and the average terrace width is 1000 nm while the gate insulating film provided above has a thickness of merely approximately 30 nm. Therefore, the thickness of the gate insulating film of the conventional vertical MOSFET is uneven, which seems to prevent the movement of carriers in a portion directly below the insulating film serving as the channel. Furthermore, it seems that an uneven electric field is applied to the gate insulating film so as to lower the breakdown voltage of the gate insulating film.

In contrast, since the macro steps are flattened in the vertical MOSFET of this embodiment, the gate insulating film 199 has an even thickness, and the movement of carriers in a portion directly below the gate insulating film 199 (namely, the p-type well 195) is not prevented, so as to improve the operation speed. Also, since an electric field is uniformly applied to the whole gate insulating film 199, the breakdown voltage of the gate insulating film is also improved. Furthermore, it seems that since the interface between the source electrode 197 and the n-type well 196 is flattened, the carrier mobility is improved as compared with that in the conventional vertical MOSFET.

In this manner, it was found that a vertical MOSFET with a high gain, a high operation speed and usable under high voltage application can be fabricated by using the SiC substrate of Embodiment 5 whose top face has been flattened.

Although the p-type well 195 is used as the channel in the vertical MOSFET of this embodiment, the conductivity of the SiC bulk substrate 193, the n-type doped layer 192 and the n-type well 196 may be of the p-type with the conductivity of the p-type well 195 being of the n-type.

Although the n-type doped layer 192 has a thickness of 10 μm in the vertical MOSFET of this embodiment, the n-type doped layer 192 may be thicker or thinner.

Also in the vertical MOSFET of this embodiment, a substrate of a polytype other than 4H—SiC may be used as in the Schottky diode of Embodiment 6.

Although the vertical MOSFET is described in this embodiment as an example of the application of the SiC substrate in which the macro steps are flattened, such a SiC substrate may be effectively used for fabricating a SiC thin film semiconductor device having any vertical structure.

Embodiment 9

As Embodiment 9 of the invention, a MOSFET fabricated by combining the method for growing a SiC thin film described in Embodiment 1 and the processing method for a substrate top face described in Embodiment 5 will be described.

First, a fabrication method for the MOSFET of this embodiment will be described.

Figure 15A:
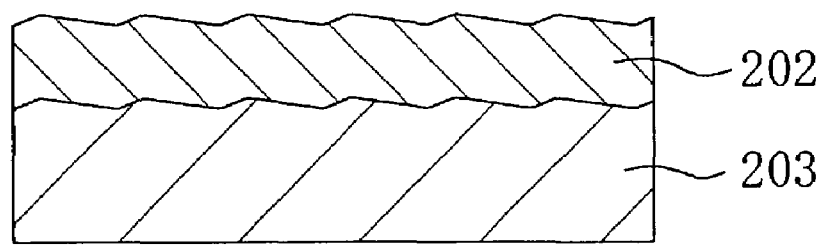
FIGS. 15A, 15B and 15C are cross-sectional views for explaining procedures for fabricating a MOSFET according to Embodiment 9 of the invention.
Figure 15B:
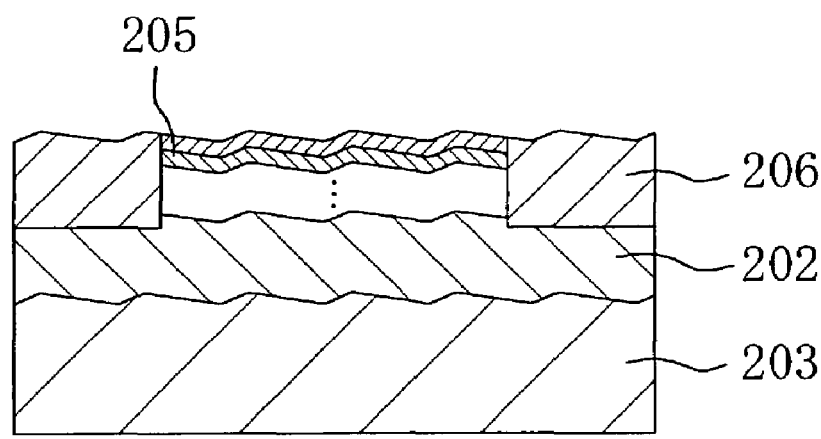
Figure 15C:
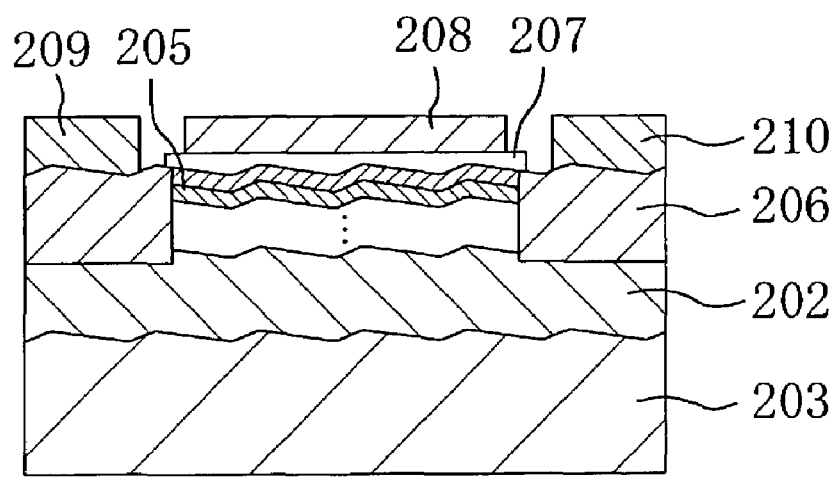

FIGS. 15A through 15C are cross-sectional views for showing the method for fabricating the MOSFET of this embodiment.

In a procedure shown in FIG. 15A, a p-type 4H—SiC substrate having, as a principal plane, a plane inclined from the (0001) plane (namely, the c-plane) at an off angle of 8 degrees in the [11-20] direction is prepared as a SiC bulk substrate 203. Next, the top face of the SiC bulk substrate 203 is flattened through the hydrogen annealing performed by the method described in Embodiment 5. This hydrogen annealing is performed in the vertical thin film growth system shown in FIG. 17 at a substrate temperature of 1450° C., at a flow rate of the hydrogen gas 125 of 2 L/min. and at a pressure within the system of approximately 5 kPa for approximately 10 minutes.

Next, a p-type doped layer 202 of SiC with a thickness of approximately 3 $\mu$m is epitaxially grown on the SiC bulk substrate by the method described in Embodiment 1. At this point, the substrate temperature and the flow rates of the material gas and the carrier gas are changed as shown in FIG. 2. The epitaxial growth temperature is 1600° C. The average step height of macro steps formed on the substrate at this point is 10 nm or less.

Subsequently, in a procedure shown in FIG. 15B, a multilayer part 205 with a thickness of 300 nm is formed by the same method as described in Embodiment 1.

Specifically, with the substrate temperature kept at 1600° C., a hydrogen gas is supplied at a flow rate of 2 L/min. as the carrier gas. At the same time, a propane gas serving as the material gas 305 of carbon and a silane gas serving as the material gas 305 of Si are supplied at flow rates of 2 mL/min. and 3 mL/min., respectively, and a nitrogen gas is intermittently supplied.

The multilayer part 205 has a structure in which a $\delta$-doped layer including nitrogen in a concentration of $1 \times 10^{18}$ atom·cm$^{-3}$ and having a thickness of 10 nm and a low concentration doped layer including nitrogen at a concentration of $1 \times 10^{16}$ atom·cm$^{-3}$ or less and having a thickness of 50 nm are alternately deposited by five layers each.

Next, nitrogen ions are implanted from above the substrate, so as to form dopant diffusion layers 206 with a carrier concentration of $1 \times 10^{18}$ atoms·cm$^{-3}$ in portions of the multilayer part 205 and upper portions of the p-type doped layer 202. Thereafter, the substrate is subjected to the activation annealing at approximately 1600° C. At this point, irregularities formed on the top face of the substrate (specifically, the top face of the dopant diffusion layers 206 and the uppermost face of the multilayer part 205) may be enlarged depending upon the conditions for the activation annealing. In such a case, the hydrogen annealing described in Embodiment 5 is performed again so as to flatten the top face of the substrate.

Next, in a procedure shown in FIG. 15C, the substrate is thermally oxidized at a temperature of approximately 1100° C., so as to form a gate insulating film 207 with a thickness of approximately 30 nm in a region on the multilayer part 205 sandwiched between the two dopant diffusion layers 206. Thereafter, Ni is deposited on the two dopant diffusion layers 206 by using the EB evaporation system and then the substrate is annealed at 1000° C., so as to from a source electrode 209 on one of the dopant diffusion layers 206 and a drain electrode 210 on the other. Subsequently, Ti is deposited on the gate insulating film 207, so as to form a gate electrode 208. The gate electrode 208 has a gate length of approximately 1 $\mu$m. Thus, the MOSFET of this embodiment is fabricated.

The MOSFET of this embodiment fabricated in the aforementioned manner includes, as shown in FIG. 15C, the SiC bulk substrate 203, the p-type doped layer 202 of SiC with a thickness of 3 $\mu$m provided on the SiC bulk substrate 203, the multilayer part 205 with a thickness of approximately 300 nm provided on the p-type doped layer 202, the gate insulating film 207 with a thickness of 30 nm provided on the multilayer part 205, the gate electrode 208 of Ti provided on the gate insulating film 207, the two dopant diffusion layers 206 including nitrogen and provided at least in the portions of the multilayer part 205 below and on both sides of the gate electrode 208, the source electrode 209 provided on one of the dopant diffusion layers 206, and the drain electrode 210 provided on the other of the dopant diffusion layers 206.

Since the method described in Embodiment 1 and the method described in Embodiment 5 are combined to fabricate the MOSFET of this embodiment, the top faces of the SiC bulk substrate 203, the p-type doped layer 202 and the multilayer part 205 are flattened. Also, the interfaces between the respective layers included in the multilayer part 205 are flattened. In this case, the step heights on the top faces of the respective layers or on the respective interfaces are all 10 nm or less, and the average step height is 3 nm or less.

In the MOSFET of this embodiment, since the interface between the $\delta$-doped layer and the low concentration doped layer is flattened, the carrier mobility from the $\delta$-doped layer to the low concentration doped layer can be improved, and furthermore, the moving speed of carriers in the low concentration doped layer functioning as the channel is improved. Therefore, the operation speed is largely increased as compared with that of a conventional MOSFET. In addition, since the thickness of the gate insulating film 207 is more even as compared with that of the conventional MOSFET, the thickness of an inverted layer formed under application of a gate voltage becomes even, so as to improve the channel mobility, which also improves the operation speed. Furthermore, breakdown is minimally caused in this MOSFET.

In addition, the method of Embodiment 1 for forming a flat epitaxially grown layer and the method of Embodiment 5 for flattening a substrate top face can be combined in the same manner as in the MOSFET of this embodiment for fabricating a Schottky diode, a MESFET or a vertical MISFET with higher performance.

-Relationship Between Channel Layer and Step Height-

Now, conditions of the relationship between a channel layer and a step height for attaining sufficiently high functions of a semiconductor device will be examined.

Figure 16:
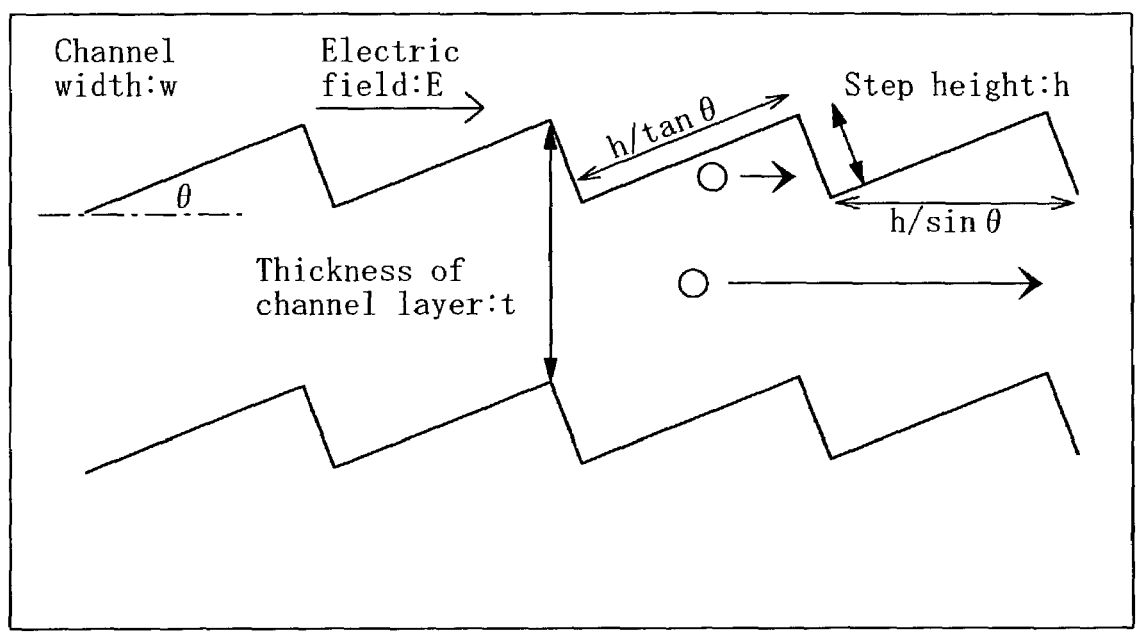
FIG. 16 is a cross-sectional view for explaining the relationship between the thickness of a channel layer and the height of a step in a semiconductor device according to the invention.

FIG. 16 is a cross-sectional view for explaining the relationship between the thickness of the channel layer and the step height in a semiconductor device of this invention. Herein, the channel layer means a layer in which carriers mainly move during the operation of the semiconductor device. The cross-section shown in FIG. 16 is taken along a direction parallel to the electric field, and a channel width w corresponds to the width of the channel layer along a direction vertical to the surface of the drawing.

As shown in FIG. 16, electrons moving in the channel layer are scattered by steps formed on the upper and lower faces of the channel layer. A current J flowing in the channel layer under application of the electric field E is represented by:

$$J = ne\mu E \quad (1)$$

wherein n indicates the density of electrons, that is, carriers, e indicates charge, and $\mu$ indicates the mobility of the electrons. As is understood from the expression (1), the current J is in proportion to the density of the electrons corresponding to the carriers. Also, in the channel layer during the operation of the semiconductor device, the charge e, the electron mobility $\mu$ and the electric field E have the same values between electrons scattered by the steps and electrons not scattered. Accordingly, as the density of the electrons scattered by the steps is larger, the current flowing through the channel layer is reduced.

Since the density of the electrons is even within the channel layer, "the density of electrons scattered by each step" can be expressed by the volume of the steps formed on the upper and lower faces, and "the density of electrons present per step" can be expressed by the volume of the channel layer per step.

It is assumed, as shown in FIG. 16, that the off angle is $\theta$, the step height is h and the thickness of the channel layer is t. Since the cross-section of each step can be approximately regarded as a right-angled triangle, the terrace width can be approximated to h/tan $\theta$ and the length of the hypotenuse of the right-angled triangle can be approximated to h/sin $\theta$. Accordingly, the volume of the steps formed on the upper and the lower faces is $h^2 \cdot w/\tan \theta$ and the volume of the channel layer is $t \cdot h \cdot w/\sin \theta$. In other words, the density of electrons scattered by each step is $h^2 \cdot w/\tan \theta$, and the density of electrons present per step is $t \cdot h \cdot w/\sin \theta$.

On the other hand, when the semiconductor device is practically used, the current reduced by the scattering caused by the steps is preferably 10% or less of the current flowing when the scattering does not occur. On the basis of the aforementioned expressions, in order to satisfy this condition, the following should be satisfied:

$$h^2 \cdot w/\tan \theta < 0.1 \times t \cdot h \cdot w/\sin \theta \quad (2)$$

In a 4H—SiC substrate, the off angle $\theta$ is 8 degrees, and hence, this is substituted in the expression (2) and the resultant is arranged to give the following:

$$h < 0.1t \quad (3)$$

This means that, in consideration of the performance of the semiconductor device, the step height is preferably 1/10 or less of the thickness of the channel layer.

In the case where the off angle $\theta$ is 0 degree through 15 degrees, the value of sin $\theta$/tan $\theta$ is not largely changed. Therefore, even when a substrate of a polytype other than 4H—SiC is used, the expression (3) can be commonly used as the reference.

For reference, in the MOSFET of Embodiment 9, since the low concentration doped layer works as the channel layer, when the channel layer has a thickness of 50 nm, the average step height is preferably 5 nm or less. Alternatively, in the MESFET of Embodiment 7, since the n-type doped layer 182 provided below the gate electrode works as the channel, the average step height is preferably 20 nm or less.

Although the relationship between the step height and the scattering is herein described by exemplifying the channel layer of a lateral FET, the scattering caused by the steps affects similarly a vertical FET if carriers move in a direction across the steps. For example, in a vertical MOSFET, the expression (3) can be applied to a channel layer provided below the gate insulating film. Thus, the condition represented by the expression (3) can be commonly used as the reference in both a vertical device and a lateral device.

Now, the lower limit value of a ratio between the step height h and the thickness t of the channel layer will be described. It is physically impossible to completely flatten the top face of a SiC layer grown with an off angle, and the step height cannot be reduced to be smaller than the diameter of an atom. Therefore, the theoretical lower limit value of the step height is approximately 0.1 nm. Also, in a practically used device, the thickness of an epitaxially grown layer through which carriers move is approximately 100 $\mu$m or less. Accordingly, the lower limit value of the ratio h/t is approximately $1 \times 10^{-6}$.

What is claimed is:

1. A semiconductor substrate comprising:
   a SiC bulk substrate; and
   an epitaxially grown layer of SiC provided over said SiC bulk substrate,
   wherein said epitaxially grown layer has a first SiC layer, and a second SiC layer including a carrier dopant in a concentration higher than in said first SiC layer, having a thickness smaller than said first SiC layer and provided on or underneath said first SiC layer,
   assuming that said first SiC layer has a thickness t and that irregularities formed on a top face of said first SiC layer have a step height h, a ratio h/t between the step height h and the thickness t of said first SiC layer is in a range from $10^{-6}$ to $10^{-1}$, and an average step height h is 5 nm or less, and
   an average step height of a top face of said second SiC layer is 5 nm or less.

2. The semiconductor substrate of claim 1, wherein a top face of said SiC bulk substrate is selected from the group consisting of an offcut plane with an off angle of 0 through 10 degrees of the $\beta$-SiC (111) plane, the $\alpha$-SiC (0001) plane of 6H—SiC or 4H—SiC, or the Si plane of 15R—SiC, and an offcut plane with an off angle of 0 through 15 degrees of the $\beta$-SiC (100) plane, the $\beta$-SiC (110) plane, the $\alpha$-SiC (1-100) plane of 6H—SiC or 4H—SiC, or the $\alpha$-SiC (11-20) plane.

3. A semiconductor device comprising:
   a bulk substrate of a compound semiconductor; and
   a first compound semiconductor layer epitaxially grown on a top face of said bulk substrate,
   wherein said first compound semiconductor layer internally includes a second compound semiconductor layer in which carriers move or pass during operation,
   an average step height of the irregularities formed on a top face of said first compound semiconductor layer is 5 nm or less, and assuming that said second compound semiconductor layer has a thickness t and that irregularities formed on a top face of said second compound semiconductor layer have a step height h, a ratio h/t between the step height h and the thickness t of said second semiconductor layer is in a range from $10^{-6}$ to $10^{-1}$, and the step height is 10 nm or less.

4. A semiconductor device comprising:

a SiC bulk substrate; and a first SiC layer epitaxially grown on a top face of said SiC bulk substrate, wherein said first SiC layer internally includes a second compound semiconductor layer in which carriers move or pass during operation, said first SiC layer further includes at least one SiC layer that includes a carrier dopant in a concentration higher than in said second compound semiconductor layer, and has a thickness smaller than said second compound semiconductor layer, the first SiC layer comprises a plurality of said second compound semiconductor layers and a plurality of said SiC layers, and the plurality of second compound semiconductor layers and the plurality of SiC layers are alternately deposited, and assuming that said second compound semiconductor layer has a thickness t and that irregularities formed on a top face of said second compound semiconductor layer have a step height h, a ratio h/t between the step height h and the thickness t of said second semiconductor layer is in a range from $10^{-6}$ to $10^{-1}$, and the step height is 10 nm or less.

5. The semiconductor device of claim 4, wherein a top face of said SiC bulk substrate is selected from the group consisting of an offcut plane with an off angle of 0 through 10 degrees of the β-SiC (111) plane, the α-SiC (0001) plane of 6H—SiC or 4H—SiC, or the Si plane of 15R—SiC, and an offcut plane with an off angle of 0 through 15 degrees of the β-SiC (100) plane, the β-SiC (110) plane, the α-SiC (1-100) plane of 6H—SiC or 4H—SiC, or the α-SiC (11-20) plane.

6. The semiconductor device of claim 4, further comprising:

a first electrode provided on said first SiC layer to be in Schottky contact with said first SiC layer; and a second electrode provided on a reverse face of said SiC bulk substrate to function as an ohmic electrode, wherein said SiC bulk substrate and said first SiC layer include dopants of an identical conductivity type.

7. The semiconductor device of claim 4, wherein a gate electrode, and a source electrode and a drain electrode respectively spaced from said gate electrode are provided on said first SiC layer, and said second compound semiconductor layer includes the dopant in a concentration higher than in a portion of said first SiC layer excluding said second compound semiconductor layer.

8. The semiconductor device of claim 4, wherein said first SiC layer includes:

a first epitaxially grown layer of SiC including a dopant of a first conductivity type and epitaxially grown on a principal plane of said SiC bulk substrate;

said second compound semiconductor layer provided on said first epitaxially grown layer and including the dopant of a second conductivity type; and a second epitaxially grown layer of SiC including a dopant of the first conductivity type and provided on said second compound semiconductor layer, said semiconductor device further comprises:

a gate insulating film provided on said first epitaxially grown layer and said second compound semiconductor layer;

a gate electrode provided on said gate insulating film;

a first ohmic electrode provided on said second epitaxially grown layer; and a second ohmic electrode provided on a face of said SiC bulk substrate opposing a principal plane thereof, and said semiconductor device functions as a vertical MISFET.

9. The semiconductor device of claim 4, further comprising:

a gate insulating film provided on said second compound semiconductor layer;

a gate electrode provided on said gate insulating film; and dopant diffusion layers including a dopant and provided in portions of said second compound semiconductor layer on both sides of said gate electrode.

10. The semiconductor substrate of claim 1, wherein the epitaxially grown layer comprises a plurality of said first SiC layers and a plurality of said second SiC layers, and the plurality of first SiC layers and the plurality of second SiC layers are alternately deposited.

11. The semiconductor substrate of claim 2, wherein an average step height of a top face of the SiC bulk substrate is 5 nm or less.

* * * * *